(12) United States Patent
Kang et al.

(10) Patent No.: US 10,811,328 B1
(45) Date of Patent: Oct. 20, 2020

(54) SEMICONDUCTOR PACKAGE

(71) Applicant: SAMSUNG ELECTRO-MECHANICS CO., LTD., Suwon-si, Gyeonggi-do (KR)

(72) Inventors: Myung Sam Kang, Suwon-si (KR); Moon Il Kim, Suwon-si (KR); Young Gwan Ko, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/513,193

(22) Filed: Jul. 16, 2019

(30) Foreign Application Priority Data

Apr. 3, 2019 (KR) .......................... 10-2019-0039027

(51) Int. Cl.
*H01L 23/055* (2006.01)
*H01L 23/498* (2006.01)
*H01L 23/31* (2006.01)
*H01L 23/00* (2006.01)

(52) U.S. Cl.
CPC ........ *H01L 23/055* (2013.01); *H01L 23/3128* (2013.01); *H01L 23/49816* (2013.01); *H01L 23/49822* (2013.01); *H01L 23/49827* (2013.01); *H01L 24/16* (2013.01); *H01L 2224/16245* (2013.01)

(58) Field of Classification Search
CPC ............... H01L 23/055; H01L 23/3128; H01L 23/49816; H01L 23/49822; H01L 23/49827; H01L 24/16; H01L 2224/16245

USPC ........................................................ 257/668
See application file for complete search history.

(56) References Cited

U.S. PATENT DOCUMENTS 9,281,284 B2 * 3/2016 Yap .................... H01L 21/52
2010/0006330 A1 1/2010 Fu et al.

FOREIGN PATENT DOCUMENTS

JP 3809053 B2 8/2006

* cited by examiner

*Primary Examiner* — Tu-Tu V Ho
(74) *Attorney, Agent, or Firm* — Morgan, Lewis & Bockius LLP

(57) ABSTRACT

A semiconductor package may include a frame including an insulation layer having a cavity formed in a lower surface of the insulation layer, a first post and a second post spaced apart from the cavity, and a metal plate disposed on an upper side of the cavity; a semiconductor chip having a first surface on which a connection pad is disposed and a second surface opposing the first surface; an encapsulant covering at least a portion of the semiconductor chip; and a connection structure disposed on the frame and the first surface of the semiconductor chip, and including one or more redistribution layers. The first post is electrically connected to the wiring layer of the frame and the redistribution layer of the connection structure, and the second post is spaced apart from the first post.

20 Claims, 18 Drawing Sheets

SEMICONDUCTOR PACKAGE

CROSS-REFERENCE TO RELATED APPLICATION

This application claims benefit of priority to Korean Patent Application No. 10-2019-0039027 filed on Apr. 3, 2019 in the Korean Intellectual Property Office, the disclosure of which may be incorporated herein by reference in its entirety.

TECHNICAL FIELD

The present disclosure relates to a semiconductor package, for example, a fan-out semiconductor package.

BACKGROUND

One of main trends in technological development related to semiconductor chips in recent years is to reduce the size of components. Therefore, in the field of packaging, it is necessary to implement a large number of pins having a small size in accordance with a surge of demand for small semiconductor chips and the like.

To meet this requirement, one proposed semiconductor package technology is a fan-out semiconductor package. The fan-out semiconductor package may redistribute an electrical connection structure beyond an area on which a semiconductor chip is disposed, thereby enabling a large number of pins to be implemented while maintaining a small size.

SUMMARY

An aspect of the present disclosure is to provide a semiconductor package having improved heat dissipation performance and a relatively high degree of design freedom.

One solution proposed in the present disclosure is to form a cavity in which a semiconductor chip is disposed by using a metal plate serving as an etching barrier, and to introduce an insulated metal post.

According to an aspect of the present disclosure, a semiconductor package includes a frame including an insulation layer having a cavity in a lower surface of the insulation layer, a first post and a second post embedded in the insulation layer and spaced apart from the cavity, a wiring layer disposed on an upper surface of the insulation layer, and a metal plate disposed on an upper side of the cavity; a semiconductor chip having a first surface on which a connection pad is disposed and a second surface opposing the first surface, and including a bump disposed on the connection pad, the semiconductor chip being disposed in the cavity and the second surface facing the metal plate; an encapsulant covering at least a portion of the semiconductor chip; and a connection structure disposed on the frame and the first surface of the semiconductor chip, and including one or more redistribution layers electrically connected to the bump of the semiconductor chip. The first post is electrically connected to the wiring layer of the frame and the redistribution layer of the connection structure, and the second post is spaced apart from the first post.

According to an aspect of the present disclosure, a semiconductor package includes a connection structure including a redistribution layer; an insulation layer disposed on the connection structure and having a cavity; a first post and a second post embedded in the insulation layer and extending from the connection structure; a semiconductor chip having a first surface on which a connection pad is disposed and a second surface opposing the first surface, and including a bump connecting the connection pad and the connection structure to each other; an encapsulant filling the cavity and separating side surfaces of the semiconductor chip and the insulating layer from each other; a metal plate disposed between the insulating layer and the second surface of the semiconductor chip; and a wiring layer disposed on the insulating layer. The first post is electrically connected to the wiring layer, the redistribution layer, and the connecting pad.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
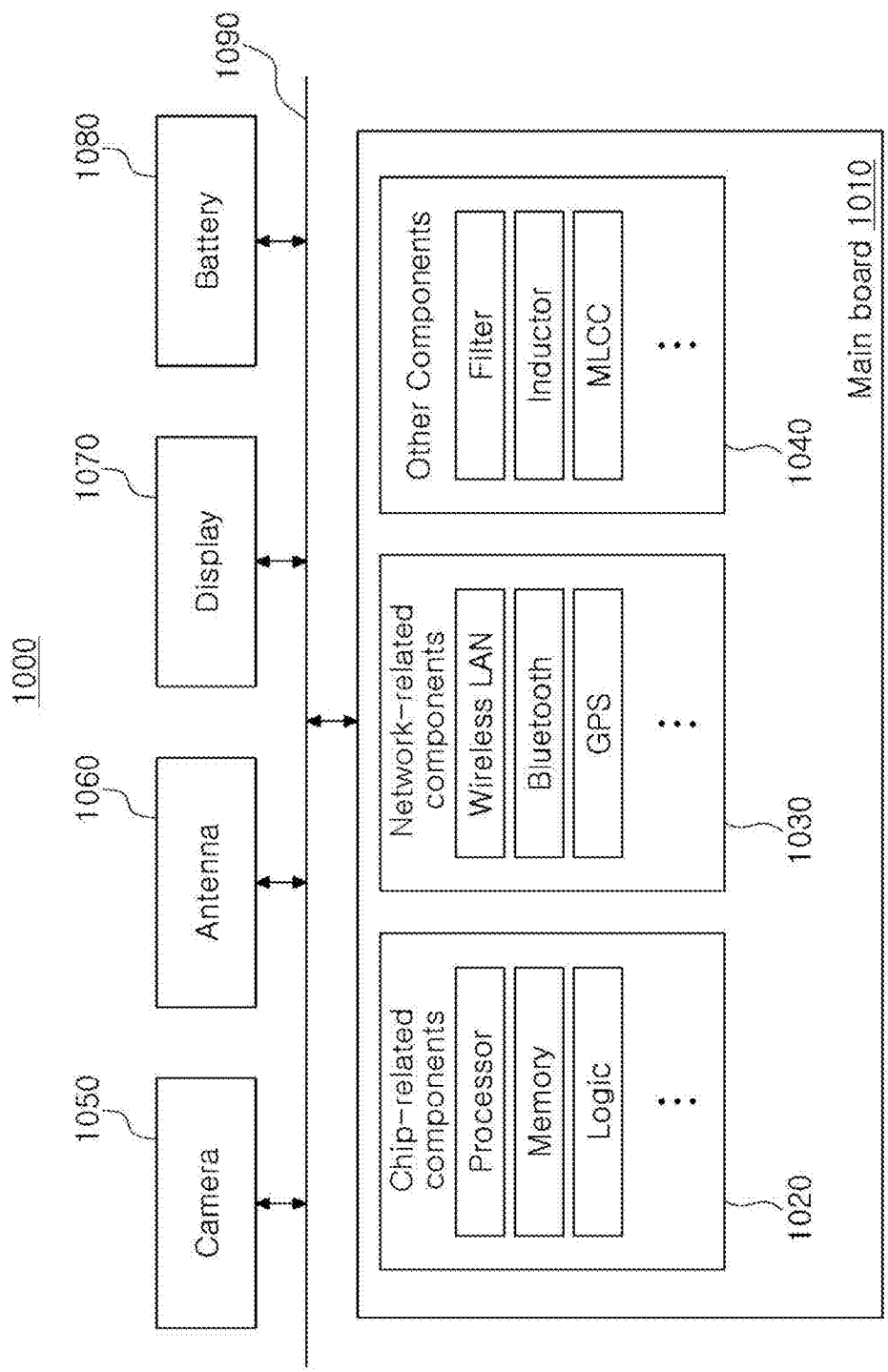
FIG. 1 is a schematic block diagram illustrating an example of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a block diagram schematically illustrating an example of an electronic device system.

Referring to the drawings, an electronic device 1000 may include a main board 1010. The main board 1010 may be physically and/or electrically connected to chip-related components 1020, network-related components 1030, and other components 1040. They may be also combined with other components to be described later to form various signal lines 1090.

The chip-related components 1020 may include a memory chip, such as a volatile memory (e.g., DRAM), a non-volatile memory (e.g., ROM), a flash memory, etc.; an application processor chip, such as a central processor (e.g., CPU), a graphics processor (e.g., GPU), a digital signal processor, a cryptographic processor, a microprocessor, a microcontroller, etc.; a logic chip, such as an analog-to-digital converter, an application-specific IC (ASICs), etc.; and the like, but are not limited thereto, and other types of chip-related components may be included. These components 1020 may be combined with each other.

The network-related components 1030 may include Wi-Fi (IEEE 802.11 family, etc.), WiMAX (IEEE 802.16 family, etc.), IEEE 802.20, long term evolution LTE, Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated as the later ones, but are not limited thereto, and any of other various wireless or wired standards or protocols may be further included. The network-related components 1030 may be combined with the chip-related components 1020, as well.

Other components 1040 may include a high frequency inductor, a ferrite inductor, a power inductor, a ferrite bead, a low temperature co-firing ceramic LTCC, an electro-magnetic interference EMI filter, and a multilayer ceramic condenser MLCC, but is not limited thereto, and may include other passive components used for various other purposes. Other components 1040 may be combined with each other, in addition to the chip-related components 1020 and/or the network-related components 1030.

Depending on the type of the electronic device 1000, the electronic device 1000 may include other components that may or may not be physically and/or electrically connected to the main board 1010. Other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk CD (not illustrated), and a digital versatile disk DVD (not illustrated), and the like, but is not limited thereto, and other components used for various purposes may be included, depending on the type of the electronic device 1000.

The electronic device 1000 may be a smartphone, a personal digital assistant, a digital video camera, a digital still camera, a network system, a computer, a monitor, a tablet computer, a laptop computer, a netbook, a television, a video game, a smartwatch, an automotive, and the like, but is not limited thereto, and may be any other electronic device that processes data.

Figure 2:
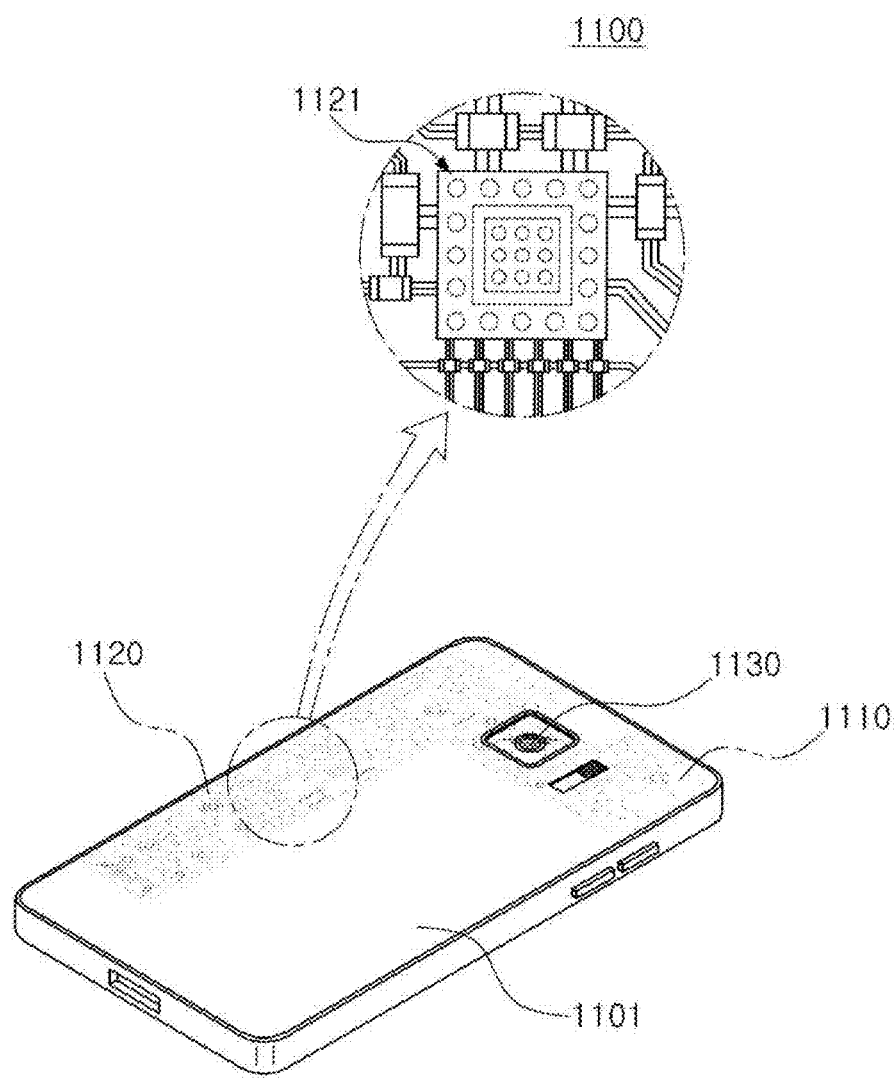
FIG. 2 is a schematic perspective view illustrating an example of an electronic device.

FIG. 2 is a perspective view schematically illustrating an example of an electronic device.

Referring to the drawings, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

In general, a semiconductor chip may have many microelectronic circuits integrated therein, but does not necessarily serve as a finished product of a semiconductor in itself, and the semiconductor chip may be damaged by an external physical or chemical impact. Therefore, the semiconductor chip itself may be not used as it is and may be packaged and used as an electronic device or the like in such a packaged state.

Semiconductor packaging may be necessary, since there may be a difference in a circuit width between a semiconductor chip and a main board of the electronic device in view of an electrical connection. Specifically, for a semiconductor chip, the size of the connection pad and the interval between connection pads are very small and narrow, whereas the size of the component mounting pad and the interval between component mounting pads are much larger and wider than the scale of the semiconductor chip, respectively. Therefore, since it is difficult to directly mount a semiconductor chip on such a main board, there is a need for a packaging technique which may buffer the difference in a circuit width therebetween.

A semiconductor package manufactured by such a packaging technique may be classified as a fan-in semiconductor package or a fan-out semiconductor package, depending on the structure and use thereof.

Hereinafter, the fan-in semiconductor package and the fan-out semiconductor package will be described in more detail with reference to the drawings.

Fan-in Semiconductor Package

Figure 3A:
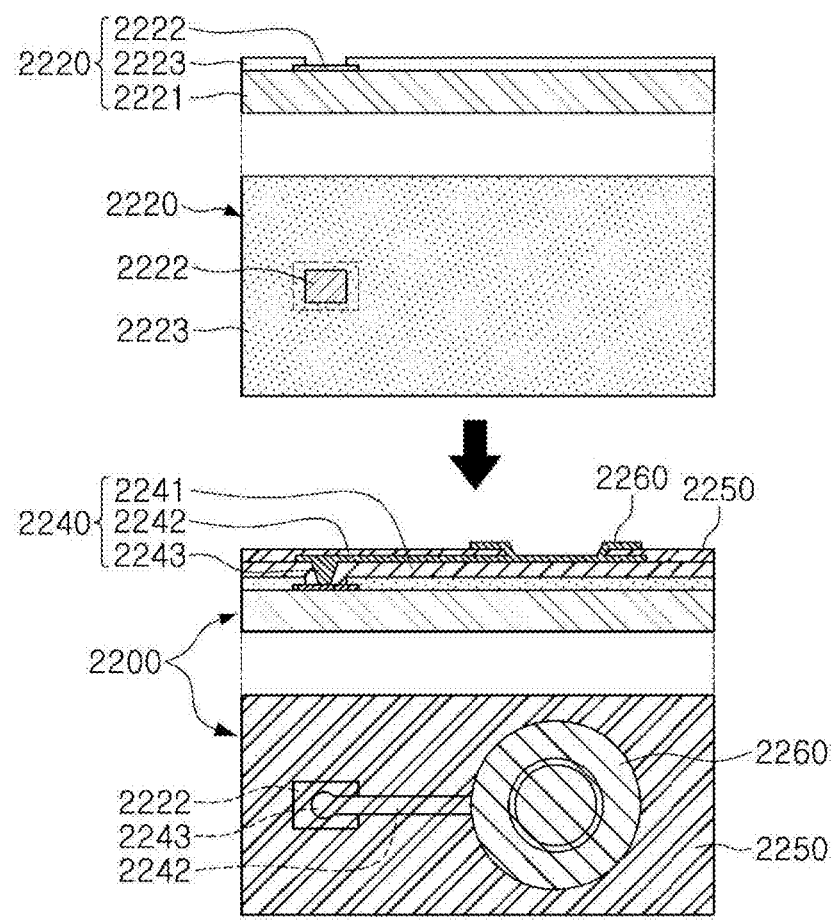
FIGS. 3A and 3B are schematic cross-sectional views illustrating states of a fan-in semiconductor package before and after being packaged.
Figure 3B:
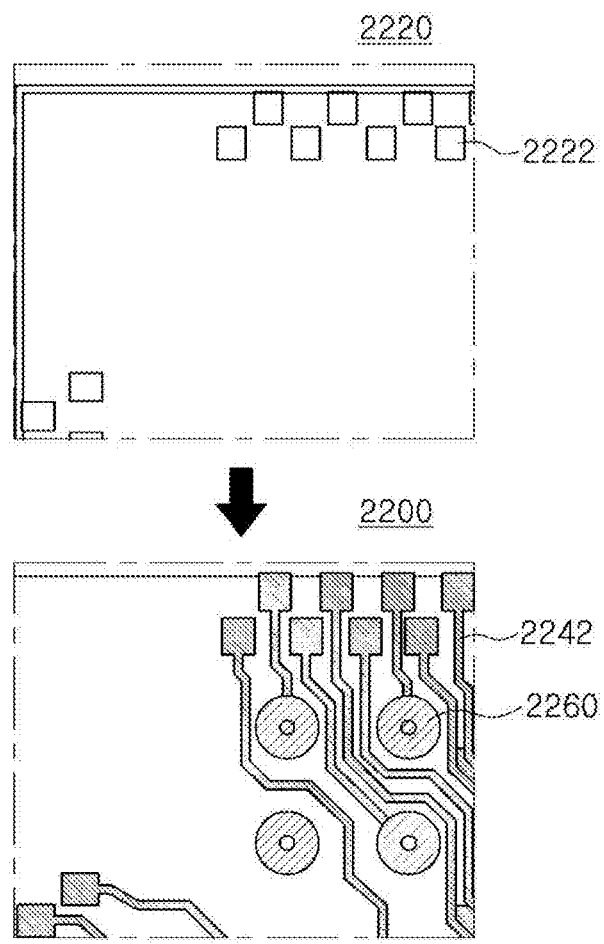

FIGS. 3A and 3B are cross-sectional views schematically illustrating a fan-in semiconductor package, before and after packaging thereof.

Figure 4:
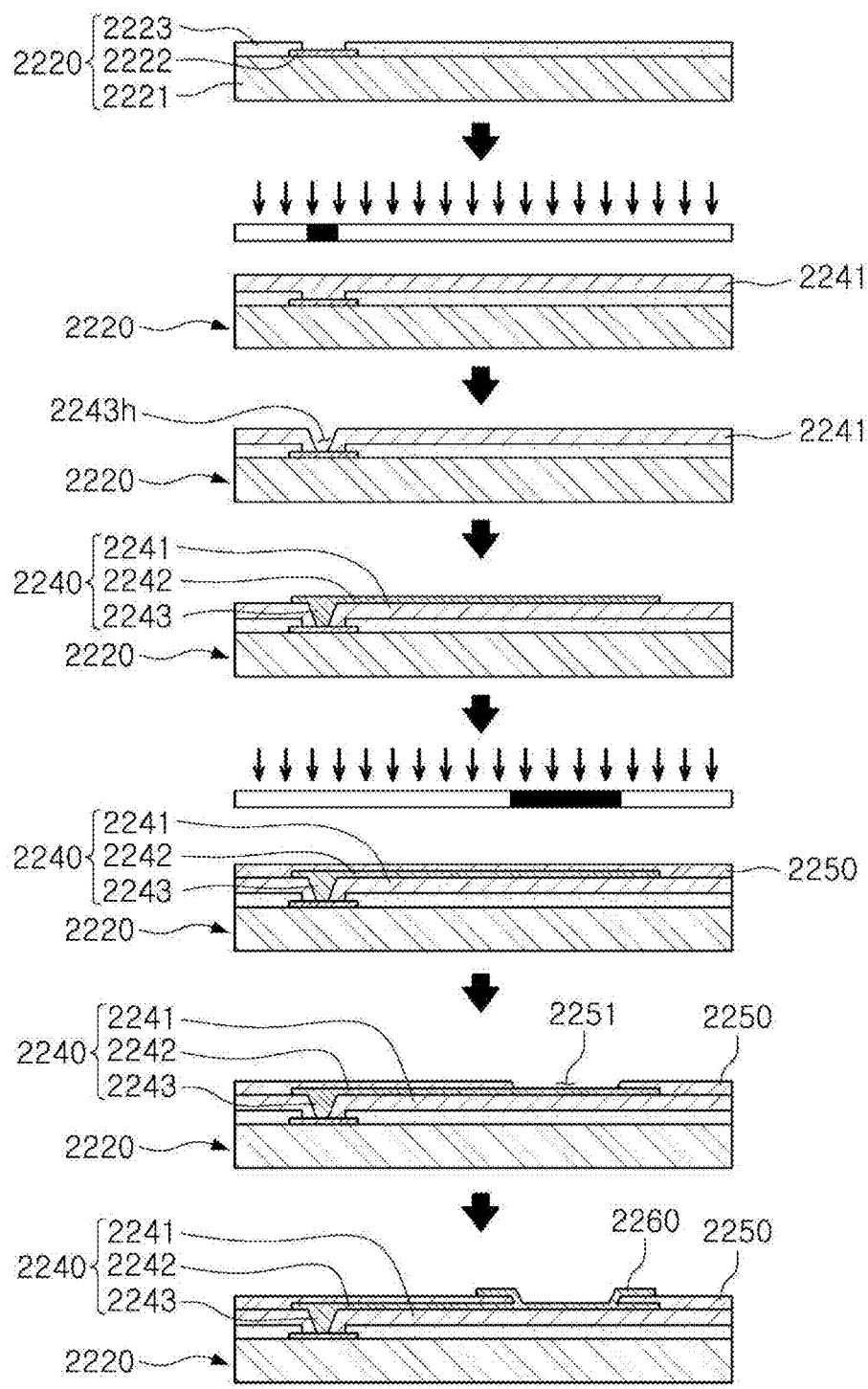
FIG. 4 is a schematic cross-sectional view illustrating a packaging process of a fan-in semiconductor package.

FIG. 4 is a cross-sectional view schematically illustrating a packaging process of a fan-in semiconductor package.

Referring to the drawings, a semiconductor chip 2220 may be an integrated circuit IC in a bare state. A body 2221 may include silicon (Si), germanium (Ge), gallium arsenide (GaAs), or the like. A connection pad 2222 may include a conductive material, such as aluminum (Al) or the like, formed on one surface of the body 2221. A passivation film 2223, such as an oxide film, a nitride film, or the like, may be formed on one surface of the body 2221 and cover at least a portion of the connection pad 2222. In this case, since the connection pad 2222 is very small, it may be difficult to mount the integrated circuit IC even on a medium-level printed circuit board PCB as well as a main board of the electronic device.

A connection structure 2240 may be formed on the semiconductor chip 2220 in conformity with the size of the semiconductor chip 2220, to redistribute the connection pad 2222. The connection structure 2240 may be prepared by way of forming an insulation layer 2241 with an insulating material such as a photo-imagable dielectric resin PID on the semiconductor chip 2220, forming a via hole 2243h for opening the connection pad 2222, and forming a wiring pattern 2242 and a via 2243. Thereafter, a passivation layer 2250 for protecting the connection structure 2240 may be formed, an opening 2251 may be formed, and an under-bump metal layer 2260 or the like may be formed. For example, a fan-in semiconductor package 2200 including, for example, the semiconductor chip 2220, the connection structure 2240, the passivation layer 2250, and the under-bump metal layer 2260 may be formed through a series of processes.

As described above, the fan-in semiconductor package may be a package type in which all the connection pads of the semiconductor chip, for example, input/output (I/O) terminals are arranged inside the element. The fan-in semiconductor package may have good electrical characteristics, and may be produced at relatively low cost. Therefore, many elements in a smartphone may be manufactured in the form of a fan-in semiconductor package. Specifically, it is being developed in a direction of achieving a small-sized form and realizing fast signal transmission at the same time.

Since, in the fan-in semiconductor package, all of the I/O terminals should be disposed inside the semiconductor chip, there may be many limitations in space. Therefore, such a structure may be difficult to apply to a semiconductor chip having a large number of I/O terminals or a semiconductor chip having a small size. In addition, due to this problem, the fan-in semiconductor package may not be directly mounted on and used in a main board of an electronic device. Even when the size and interval of the I/O terminals of the semiconductor chip are enlarged in a redistributing process, they do not have a size and an interval enough to be directly mounted on the main board of the electronic device.

Figure 5:
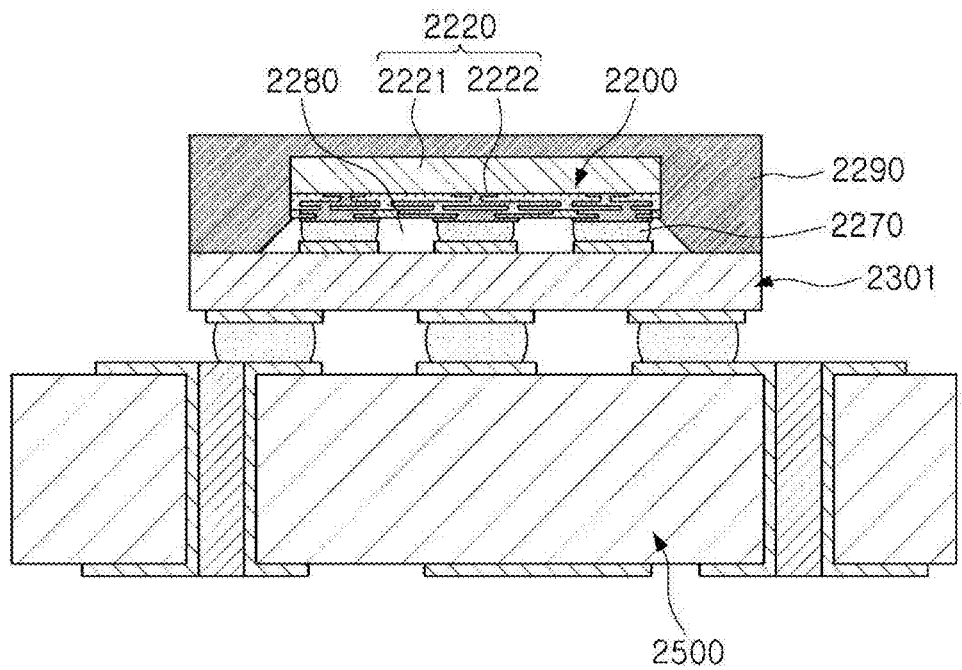
FIG. 5 is a schematic cross-sectional view illustrating a case in which a fan-in semiconductor package is mounted on an interposer substrate and is ultimately mounted on a mainboard of an electronic device.

FIG. 5 is a cross-sectional view schematically illustrating a fan-in semiconductor package mounted on a printed circuit board that is ultimately mounted on a main board of an electronic device.

Figure 6:
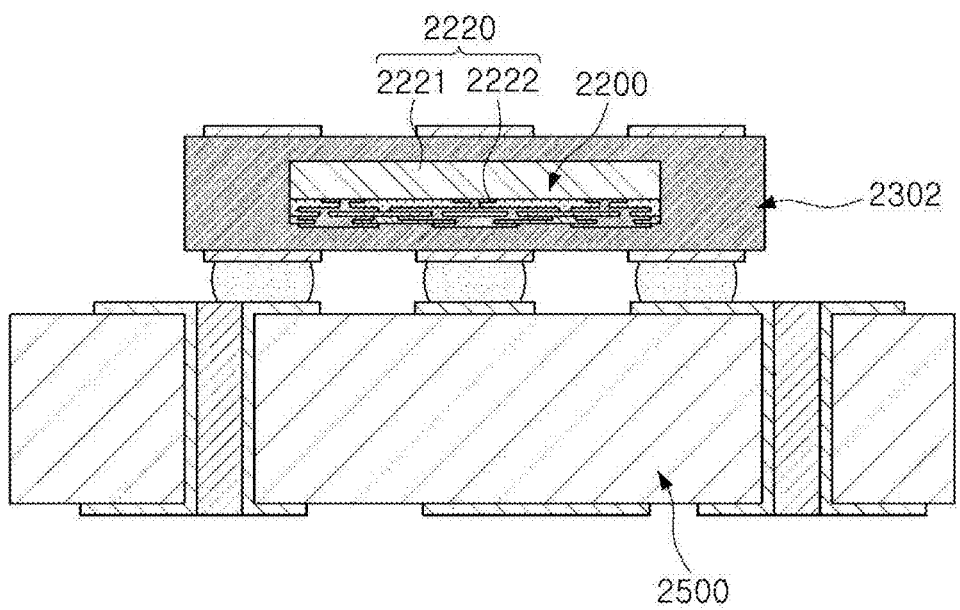
FIG. 6 is a schematic cross-sectional view illustrating a case in which a fan-in semiconductor package is embedded in an interposer substrate and is ultimately mounted on a mainboard of an electronic device.

FIG. 6 is a cross-sectional view schematically illustrating a fan-in semiconductor package embedded in a printed circuit board that is ultimately mounted on a main board of an electronic device.

Referring to the drawings, a fan-in semiconductor package 2200 may be configured such that connection pads 2222 of a semiconductor chip 2220, i.e. I/O terminals are redistributed once again through an interposer substrate 2301, and the fan-in semiconductor package 2200 mounted on the interposer substrate 2301 is mounted on a main board 2500 of an electronic device. In this case, a solder ball 2270 and the like may be fixed with an underfill resin 2280, and an outer side thereof may be covered with a molding material 2290 or the like. Alternatively, the fan-in semiconductor package 2200 may be embedded in a separate interposer substrate 2302, and the connection pads 2222 of the semiconductor chip 2220, i.e., the I/O terminals may be redistributed once again in an embedded form by the interposer substrate 2302, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the interposer substrate.

Fan-Out Semiconductor Package

Figure 7:
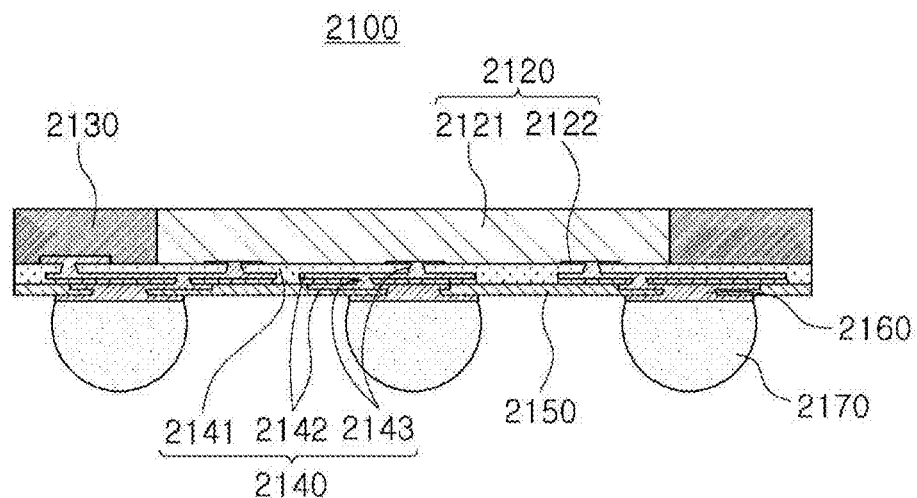
FIG. 7 is a schematic cross-sectional view illustrating a fan-out semiconductor package.

FIG. 7 is a cross-sectional view schematically illustrating a fan-out semiconductor package.

Referring to the drawings, in a fan-out semiconductor package 2100, for example, an outer side of a semiconductor chip 2120 may be protected by an encapsulant 2130, and connection pads 2122 of the semiconductor chip 2120 may be redistributed to the outer side of the semiconductor chip 2120 through a connection structure 2140. A passivation layer 2150 may be further formed on the connection structure 2140. An under-bump metal layer 2160 may be further formed on an opening of the passivation layer 2150. A solder ball 2170 may be further formed on the under-bump metal layer 2160. The semiconductor chip 2120 may be an integrated circuit IC including a body 2121, a connection pad 2122, and the like. The connection structure 2140 may include an insulation layer 2141, a wiring layer 2142 formed on the insulation layer 2241, and a via 2143 for electrically connecting the connection pad 2122 and the wiring layer 2142.

The fan-out semiconductor package may be formed by redistributing the I/O terminals to the outer side of the semiconductor chip through the connection structure formed on the semiconductor chip. As described above, in a fan-in semiconductor package, all of the I/O terminals of the semiconductor chip should be disposed inside of the semiconductor chip. When the size of the element is reduced, the size and pitch of the ball should be reduced. Therefore, the standardized ball layout may be not used. On the other hand, in a fan-out semiconductor package, the I/O terminals may be redistributed outward from the semiconductor chip through the connection structure formed on the semiconductor chip. Although the size of the semiconductor chip is reduced, the standardized ball layout may be used as it is. Therefore, the fan-out semiconductor package may be mounted on a main board of an electronic device without a separate printed circuit board, as described later.

Figure 8:
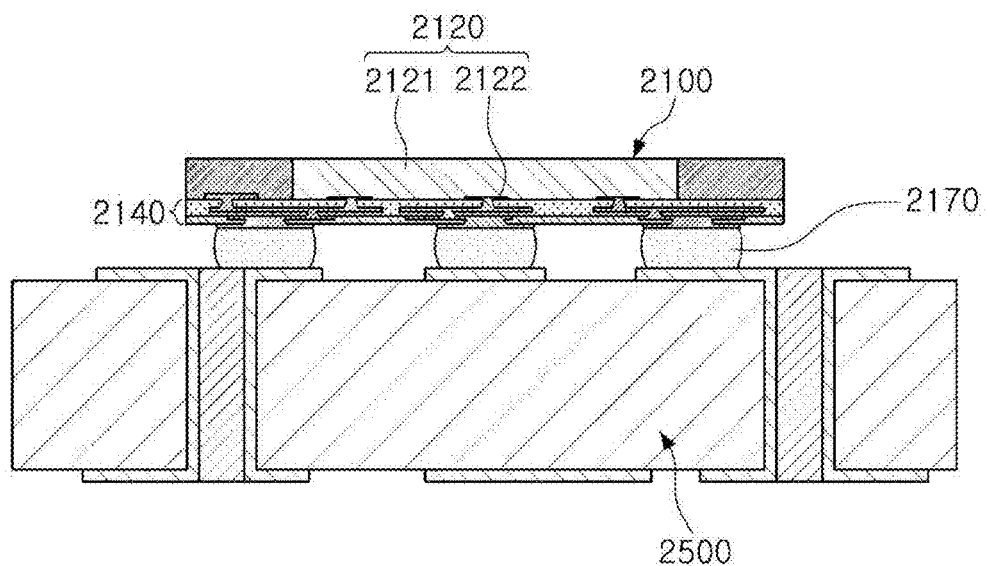
FIG. 8 is a schematic cross-sectional view illustrating a case in which a fan-out semiconductor package is mounted on a mainboard of an electronic device.

FIG. 8 is a cross-sectional view schematically illustrating a fan-out semiconductor package mounted on a main board of an electronic device.

Referring to the drawings, a fan-out semiconductor package 2100 may be mounted on a main board 2500 of an electronic device through a solder ball 2170 or the like. For example, as described above, the fan-out semiconductor package 2100 may include a connection structure 2120 on the semiconductor chip 2120 that may redistribute connection pads 2122 to a fan-out area beyond a size of the semiconductor chip 2120. The standardized ball layout may be used as it is, and as a result, it may be mounted on the main board 2500 of the electronic device without a separate printed circuit board or the like.

Since the fan-out semiconductor package may be mounted on the main board of the electronic device without a separate interposer substrate, as above, the fan-out semiconductor package may be made thinner than the fan-in semiconductor package using the interposer substrate. Therefore, a downsizing and thinning in the fan-out semiconductor package may be accomplished. It may be also suitable for mobile products because of its excellent thermal and electrical properties. In addition, it may be implemented more compactly than a general package-on-package POP type using a printed circuit board PCB, and a problem caused by a bending phenomenon may be prevented.

The fan-out semiconductor package may refer to a package technology for mounting the semiconductor chip on a main board of the electronic device, or the like, and for protecting the semiconductor chip from an external impact, and may have a concept different from a printed circuit board PCB, such as a printed circuit board in which a fan-in semiconductor package is embedded, which are different from each other in view of scale, use, and the like.

Hereinafter, various embodiments of the present disclosure may be described with reference to the drawings.

Figure 9:
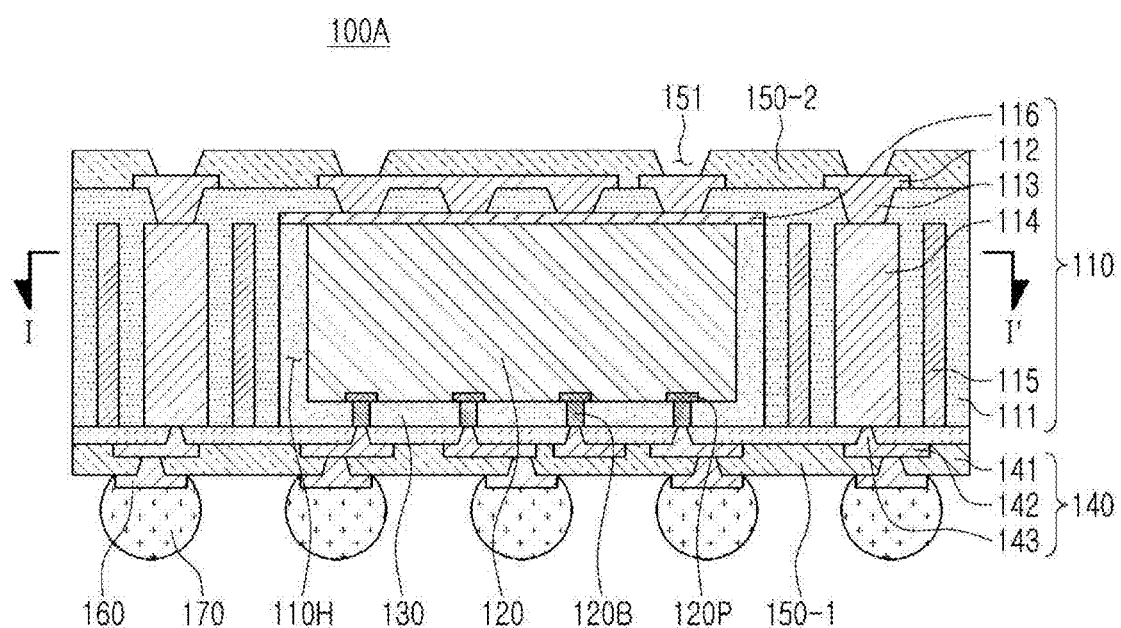
FIG. 9 is a schematic cross-sectional view illustrating a semiconductor package according to an example.

FIG. 9 is a schematic cross-sectional view illustrating a semiconductor package according to an example.

Referring to FIG. 9, a semiconductor package 100A according to an example embodiment may include a frame 110 including an insulation layer 111 having a cavity 110H formed on a lower surface of the insulation layer 111, a first post 114 and a second post 115 embedded in the insulation layer 111 and spaced apart from the cavity 110H, a wiring layer 112 disposed on an upper surface of the insulation layer 111, and a metal plate 116 disposed on an upper side of the cavity 110H; a semiconductor chip 120 having a first surface on which a connection pad 120P is disposed and a second surface opposing the first surface, and including a bump 120B disposed on the connection pad 120P, the second surface of the semiconductor chip being disposed in the cavity 110H to face the metal plate 116; an encapsulant 130 covering at least a portion of the semiconductor chip 120; and a connection structure 140 disposed on the frame 110 and the first surface of the semiconductor chip 120, and including one or more redistribution layers 142 electrically connected to the bump 120B of the semiconductor chip 120. The first post 114 may be electrically connected to the wiring layer 112 of the frame 110 and the redistribution layer 142 of the connection structure 140, and the second post 115 may be spaced apart from the first post 114 by a predetermined distance.

The cavity 110H may be a groove structure, recessed into the insulation layer 111 from one surface of the insulation layer 111, without passing through the frame 110, and may serve as a barrier for preventing from passing the metal plate 116, disposed on one side of the cavity 110H, through the insulation layer 111. As described later, since the cavity 110H may be formed by etching a cavity metal, a shape of the cavity 110H may be freely designed by designing the cavity metal in a specific form.

The first post 114 may be electrically connected to the wiring layer 112 and the redistribution layer 142, to form an electrical path inside the frame 110. The second post 115 may be spaced apart from the first post 114 by a predetermined distance, not to physically contact the first post 114 within the frame 110. For example, the second post 115 may be physically separated from the first post 114, and may be formed in a space in which the first post 114 is not disposed, to increase a volume of a metal surrounding the semiconductor chip 120. Therefore, the heat dissipation performance of the package may be improved. Meanwhile, the second posts 115 may be electrically connected to a ground pattern of the wiring layer 112 and the redistribution layer 142, to be used as a ground.

In addition, since the encapsulant 130 on the frame 110, except for the encapsulant 130 filling the cavity 110H, is removed by a grinding process, a thickness of the package may be reduced and warpage by encapsulant 130 may be minimized at the same time.

Figure 10A:
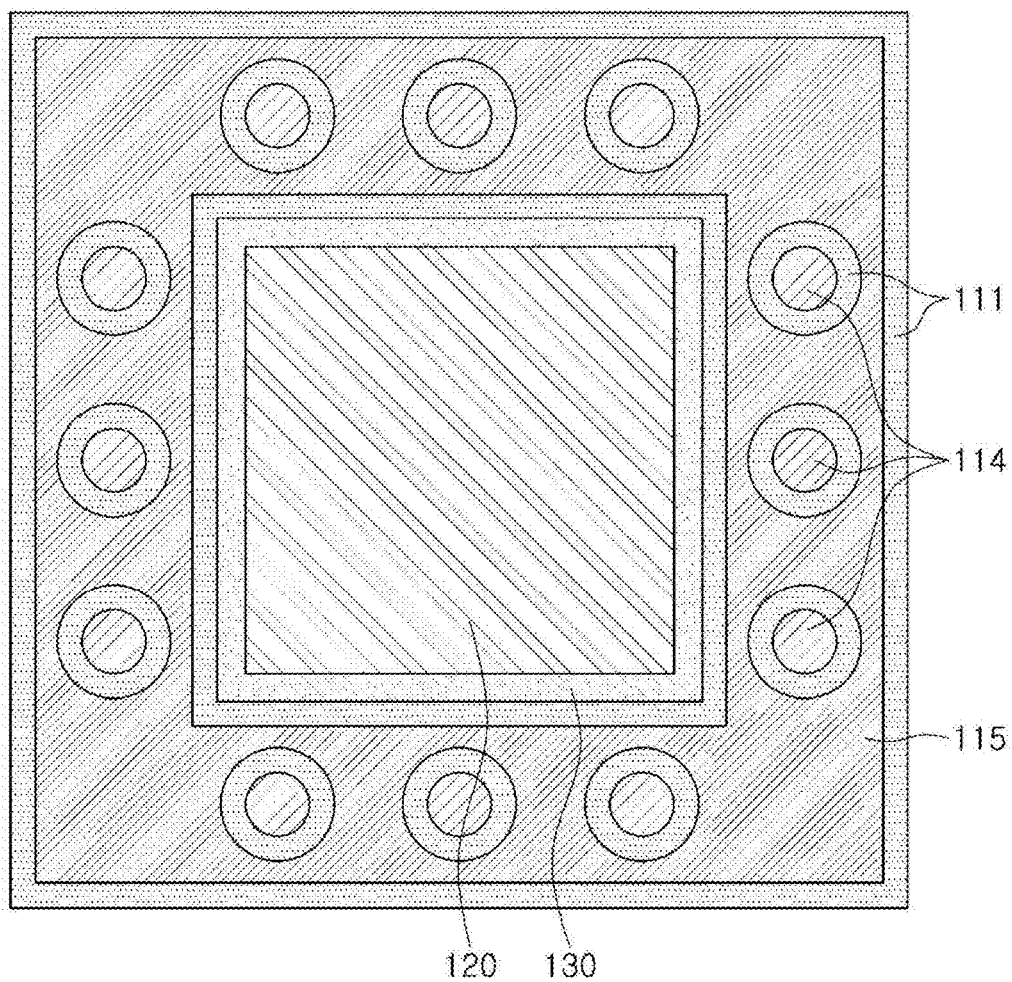
FIGS. 10A to 10C are schematic plan views illustrating a cross-section taken along line I-I' of FIG. 9.
Figure 10B:
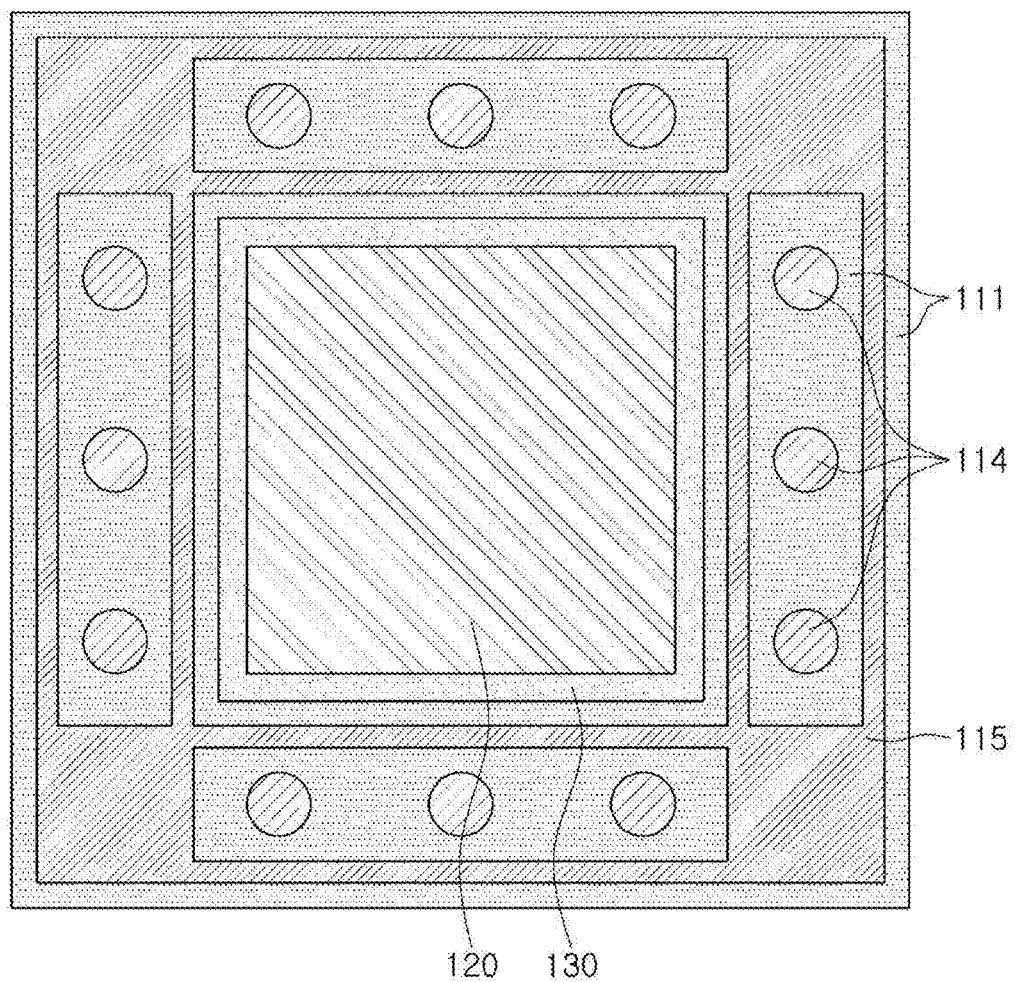
Figure 10C:
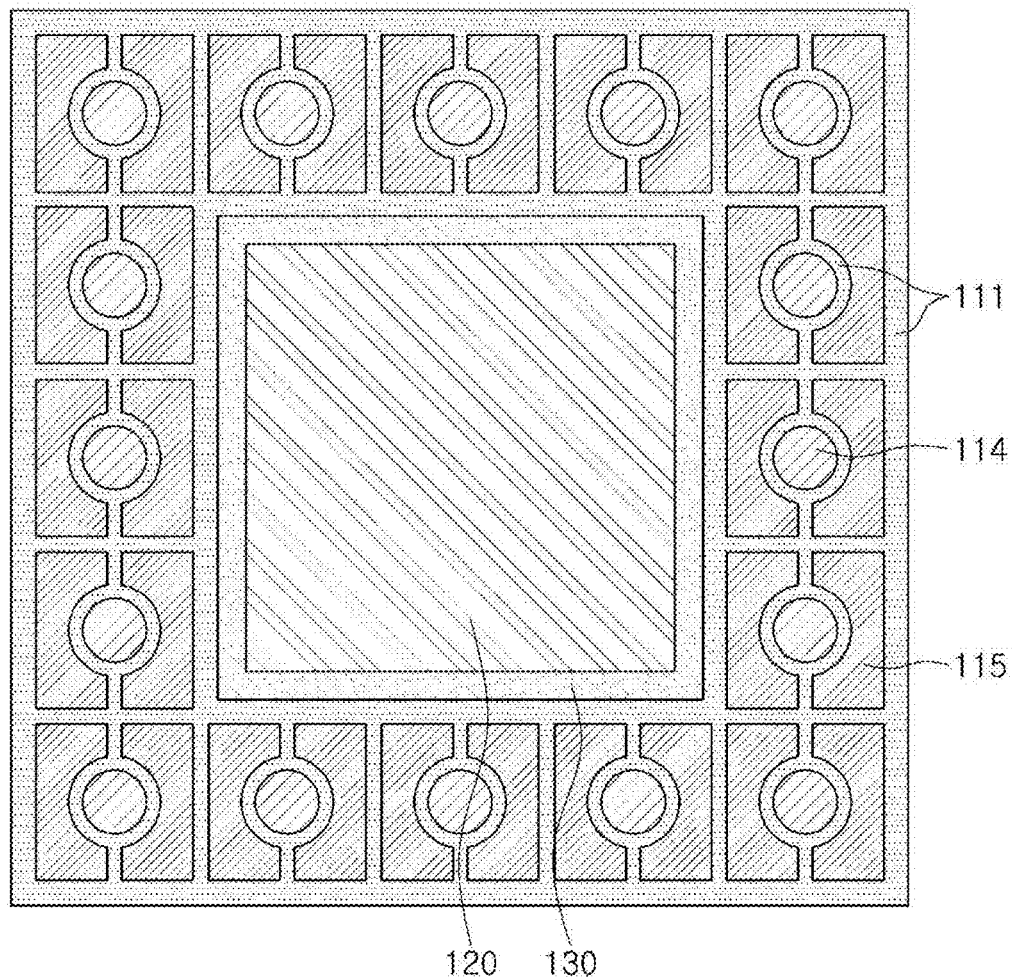

FIGS. 10A to 10C are schematic plan views illustrating a cross-section taken along line I-I' of FIG. 9.

Referring to FIGS. 10A to 10C, a semiconductor package 100A according to an example may include a first post 114 and a second post 115 of a metallic material surrounding the cavity in which the semiconductor chip 120 is disposed. A plurality of first posts 114 may be arranged around the semiconductor chip 120 at a random interval, and a plurality of second posts 115 may be arranged so as not to overlap the first post 114, and in particular, may be intensively disposed in a region in which the first post 114 is distributed in a relatively small number. A shape of the second post 115 illustrated in FIGS. 10A to 10C may be for illustrative purposes only, and is not limited thereto.

Hereinafter, each configuration included in the semiconductor package 100A according to an example will be described in more detail.

The frame 110 may improve rigidity of the semiconductor package 100A in accordance with a specific material, and may play a role of ensuring uniformity of a thickness of the encapsulant 130. The frame 110 may have at least one cavity 110H. The cavity 110H may be recessed from one side of the frame 110, and the semiconductor chip 120 may be disposed in the cavity 110H. The semiconductor chip 120 may be spaced apart from a wall surface of the cavity 110H by a predetermined distance, and may be surrounded by a wall surface of the cavity 110H. It can be understood that the present disclosure is not limited to the above-described embodiments, and that various changes and modifications may be made without departing from the scope and spirit of the present disclosure.

Since the frame 110 may include the wiring layer 112, the connection structure 140 may be further simplified. Therefore, a reduction in yield due to defects generated in the process of forming the connection structure 140 may be improved. In particular, since the wiring layer 112 may be disposed on an inactive surface of the semiconductor chip 120, a backside wiring layer for the semiconductor chip 120 may be provided without forming a separate backside wiring layer, and process costs for forming a separate backside wiring layer may be reduced.

The metal plate 116 may be disposed on the upper surface of the cavity 110H. The semiconductor chip 120 may be disposed on the metal plate 116. In addition, the metal plate 116 may function as an etch stop layer for forming the cavity 110H.

A process of forming the cavity 110H is not particularly limited, and may be formed through an etching operation. As described later, the cavity metal may be removed to use a space previously occupied by the cavity metal as a cavity, and a shape of the cavity may depend on a shape of a cavity metal. For example, a shape of a wall surface of the cavity may correspond to a shape of the side wall of the cavity metal, and a width of the cavity 110H may correspond to a width of the metal plate 116. In this case, an interval between the semiconductor chip 120 and the side wall of the cavity 110H may be maintained constant to increase heat radiation efficiency through the frame 110.

Materials of the insulation layer 111 are not particularly limited. For example, a resin containing reinforcing materials such as inorganic fillers such as silica, alumina, or the like, together with a thermosetting resin such as an epoxy resin and a thermoplastic resin such as polyimide, specifically an Ajinomoto Build-up Film (ABF), FR-4, bismaleimide triazine (BT), a photoimagable dielectric (PID) resin, etc. may be used. Alternatively, a material impregnated with a core material such as glass fiber, glass cloth, glass fabric, or the like, together with a thermosetting resin or a thermoplastic resin, and an inorganic filler, for example, a prepreg, or the like may be used. In this case, excellent rigidity may be maintained, and the frame 110 may be used as a kind of supporting member.

The wiring layer 112 may perform a role of redistributing the connection pads 120P of the semiconductor chip 120. As a material for forming the wiring layer, a conductive material such as copper (Cu), aluminum (Al), silver (Ag), tin (Sn), gold (Au), nickel (Ni), lead (Pb), titanium (Ti), or alloys thereof may be used. The wiring layer 112 may perform various functions, depending on a desired design of the layer. For example, a ground (GND) pattern, a power (PWR) pattern, a signal (S) pattern, and the like, may be included. In this case, the signal (S) pattern may include various signals except for a ground (GND) pattern, a power (PWR) pattern, and the like, for example, a data signal and the like. Via pads, connection terminal pads, and the like may also be included. As a non-limiting example, all the wiring layers 112 may include a ground pattern. In this case, since the ground pattern may be minimized and formed in the redistribution layer 142 of the connection structure 140, the degree of wiring design freedom may be improved.

A surface treatment layer (not illustrated) may be further formed on the wiring layer 112 exposed through an opening 151 formed in a second passivation layer 150-2 on the wiring layer 112, as necessary. The surface treatment layer (not illustrated) is not particularly limited as long as it is known in the art, and, for example, may be formed by an electrolytic gold plating process, an electroless gold plating process, OSP or an electroless tin plating process, an electroless silver plating process, an electroless nickel plating/ substitution gold plating process, a DIG plating process, a HASL process, or the like. A thickness of the wiring layer 112 of the frame 110 may be thicker than a thickness of the redistribution layer 142 of the connection structure 140. This is because the frame 110 may have a thickness equivalent to that of the semiconductor chip 120, while the connection structure 140 is required to be thinned, and the procedures thereof may be also different from each other.

The connection via 113 may electrically connect the wiring layer 112 to the first post 114. Therefore, an electrical path in the frame 110 may be formed. The connection via 113 may also be formed of a conductive material. The connection via 113 may be completely filled with a conductive material, or a conductive material may be formed along a wall surface of a via hole. In addition, all known shapes such as not only a tapered shape but also a cylindrical shape may be applied. When a hole for the connection via 113 is formed, the upper surface of the first post 114 may serve as a stopper. The connection via 113 having a tapered shape, for example, a width of the upper surface wider than that of the lower surface may be advantageous in terms of the process. In this case, the connection via 113 may be integrated with a portion of the wiring layer 112.

The first post 114 may electrically connect the wiring layer 112, formed on the second surface of the frame 110, through the connection via 113, to the redistribution layer 142, formed on the first surface of the frame 110. Therefore, an electrical path in the frame 110 may be formed. As the material of the first post 114, a conductive material may also be used. The first post 114 may be completely filled with a conductive material, and may have various shapes such as a cylindrical shape, a polygonal columnar shape, and the like.

The second post 115 may be physically spaced apart from the first post 114 in a region not overlapping the first post 114. Therefore, the degree of distribution of the conductive material within the frame 110 may be increased. The second post 115 may also use a conductive material such as copper (Cu), aluminum (Al), silver (Ag), tin (Sn), gold (Au), nickel (Ni), lead (Pb), titanium (Ti), or alloys thereof as a material for forming the same. The first post 114 may be disposed at a certain interval around the semiconductor chip 120, and the second post 115 may be disposed not to overlap the first post 114, and, in particular, may intensively be disposed in a region in which the first post 114 is distributed in a relatively small number. Therefore, the second post 115 may be in the form of a column having various types of flat cross-sections.

The first post 114 and the second post 115 described above may include a conductive material to provide a path for dissipating heat generated in the semiconductor chip 120. Particularly, the second posts 115 may intensively be disposed in a region in which the first post 114 is distributed in a relatively small number, contributing to improvement of the heat dissipation performance of the package.

The semiconductor chip 120 may be an integrated circuit (IC) in which hundreds to millions of devices are integrated into one chip. The semiconductor chip 120 may be a memory chip such as a volatile memory (for example, a dynamic random access memory (DRAM)), a non-volatile memory (for example, a read only memory (ROM)), a flash memory, or the like; an application processor chip, such as a central processor (e.g., CPU), a graphics processor (e.g., GPU), a digital signal processor, a cryptographic processor, a microprocessor, and the like; an analog-to-digital converter, a logic chip such as an application-specific IC (ASIC), or the like, but is not necessarily limited thereto.

The semiconductor chip 120 may be formed on the basis of an active wafer. In this case, silicon (Si), germanium (Ge), gallium arsenide (GaAs), or the like may be used as a base material constituting a body. Various circuits may be formed in the body. The connection pad 120P may be used to electrically connect the semiconductor chip 120 to other components. As a formation material thereof, a conductive material such as aluminum (Al) may be used without any particular limitation. A surface on which the connection pad 120P is disposed may become an active surface, and a surface opposite thereto may become an inactive surface. As necessary, a passivation film covering at least a portion of the connection pad 120P may be formed on the body. The passivation film may be an oxide film or a nitride film, or may be a double layer of an oxide film and a nitride film. An insulating film (not illustrated) or the like may be further disposed in other necessary positions.

The semiconductor chip 120 may include a bump 120B disposed on and connected to the connection pad 120P. The bump 120B may be made of a metal such as copper (Cu), or may be also a solder material. As can be seen from a procedure to be described later, a semiconductor package 100A according to an example may be treated with a grinding process. In this case, a surface of the first post 114 of the frame 110, connected to the redistribution layer 142, may be located on the same level as a surface of the bump 120B of the semiconductor chip 120, connected to the redistribution layer 142. The same level may be a concept including minute differences due to process errors. A height of a via 143 for connecting the bump 120B to the redistribution layer 142 and a height of a via 143 for connecting the first post 114 to the redistribution layer 142 may be the same to each other. The same height may be also a concept including minute differences due to process errors. When a surface on which the connection structure 140 is formed is flat as described above, the insulation layer 141 may be formed to be flat. Therefore, the redistribution layer 142 and the via 143 may be formed more finely. Meanwhile, although the package 100A according to an example illustrates a structure in which one semiconductor chip 120 is included, a plurality of semiconductor chips 120 may be used as needed.

The encapsulant 130 may be filled in the cavity 110H to protect the semiconductor chip 120 and the like. A shape of the encapsulant 130 is not particularly limited, and may be a shape that covers at least a portion of the semiconductor chip 120. For example, the encapsulant 130 may cover an active surface of the semiconductor chip 120, and may fill a space between a wall surface of the cavity 110H and a side surface of the semiconductor chip 120. The cavity 110H may be filled with the encapsulant 130, to act as an adhesive in accordance with the specific material, and may reduce a buckling phenomenon at the same time.

The material of the encapsulant 130 is not particularly limited. For example, an insulating material may be used. In this case, as the insulating material, a thermosetting resin such as an epoxy resin, a thermoplastic resin such as polyimide, or a mixture of these resins with an inorganic filler, or a resin impregnated with a core material such as a glass fiber, a glass cloth, or a glass fabric, such as a prepreg, an Ajinomoto Build-up Film (ABF), FR-4, a bismaleimide triazine (BT), or the like, may be used. A photosensitive material, for example, a photo imagable encapsulant (PIE) may be used as needed.

In a package 100A according to an example, the encapsulant 130 may not be formed on the first surface of the frame 110 other than an inner space of the cavity 110H. In a grinding process to be described later, the encapsulant 130 covering the first surface of the frame 110, for example, lower surfaces of the first post 114 and the second post 115, may be removed to leave only the encapsulant 130 filling the cavity 110H. Therefore, a step difference between the encapsulant 130 formed on the semiconductor chip 120 and the encapsulant 130 formed on the frame 110 may be removed to realize a flat surface. For example, a boundary surface between the connection structure 140 and the bump 120B of the semiconductor chip may be located on the same level as a boundary surface between the connection structure 140 and the encapsulant 130, and a boundary surface between the connection structure 140 and the first post 114 may be located on the same level as a boundary surface between the connection structure 140 and the bumps 120B of the semiconductor chip. In this case, the same level may be a concept including minute differences due to process errors.

The connection structure 140 may include a redistribution layer 142 disposed on one side of the frame 110 and electrically connected to the semiconductor chip 120. For example, the connection structure 140 may redistribute the connection pad 120P of the semiconductor chip 120, and may electrically connect the wiring layer 112 of the frame 110 to the connection pad 120P of the semiconductor chip 120. Tens to millions of semiconductor chips having various functions may be redistributed through the connection structure 140, and may be physically and/or electrically connected to the outside according to their functions through an electrical connection metal 170. The connection structure 140 may include an insulation layer 141 disposed on the active surface of the frame 110 and the semiconductor chip 120, a redistribution layer 142 disposed on the insulation layer 141, and a connection via 143 passing through the insulation layer 141 and connecting any one of the connection pad 120P and the first posts 114 to the redistribution layer 142 of respective layer. The insulation layer, the redistribution layer, and the connection via of the connection structure 140 may be designed with fewer or greater numbers of layers than that illustrated in the drawings.

As the material of the insulation layer 141, an insulating material may be used. In this case, in addition to the above-described insulating material, a photosensitive insulating material such as a PID resin may be used as the insulating material. For example, the plurality of insulation layer 141 may be a photosensitive insulation layer, respectively. When the insulation layer 141 has photosensitivity, the insulation layer 141 may be made thinner and the fine pitch of the connection via 143 may be more easily achieved. The insulation layer 141 may be a photosensitive insulation layer containing an insulating resin and an inorganic filler. When the insulation layer 141 has multiple layers, these materials may be the same as each other, and may be different from each other, as needed. When the insulation layer 141 is in multilayer form, since they are unified depending on a process, the boundaries may be unclear in themselves. Also, a larger number of insulation layers than those illustrated in the drawings may be formed.

The redistribution layer 142 may substantially redistribute the connection pad 122, and may use a conductive material such as copper (Cu), aluminum (Al), silver (Ag), tin (Sn), gold (Au), nickel (Ni), lead (Pb), titanium (Ti), or alloys thereof as a formation material thereof. The redistribution layer 142 may perform various functions, depending on a desired design of the layer. For example, a ground (GND) pattern layer (not illustrated) may be included, and a power (PWR) pattern, a signal (S) pattern, or the like may be further included. In this case, the signal (S) pattern may include various signals except for a ground (GND) pattern, a power (PWR) pattern, and the like, for example, a data signal and the like. In addition, the redistribution layer 142 may include a via pad pattern. Although not illustrated in the drawing, the redistribution layers 142 may be formed with fewer or greater numbers of the redistribution layers 142 than that illustrated in the drawings.

The redistribution via 143 may electrically connect the redistribution layer 142, the connection pad 122, the first wiring layer 112a, the like, formed on different layers. Therefore, an electrical path in the package 100A may be formed. The redistribution via 143 may use a conductive material such as copper (Cu), aluminum (Al), silver (Ag), tin (Sn), gold (Au), nickel (Ni), lead (Pb), titanium (Ti), or alloys thereof as a formation material thereof. The redistribution via 143 may be completely filled with a conductive material, or a conductive material may be formed along a wall surface of a via hole. In addition, all shapes known in the art such as not only a tapered shape but also a cylindrical shape may be applied.

A first passivation layer 150-1 may protect the connection structure 140 from external physical or chemical damage, or the like. The first passivation layer 150-1 may have openings that expose at least a portion of the redistribution layer 142 of the connection structure 140. These openings may be formed in the first passivation layer 150-1 in the range of tens to millions. A material of the first passivation layer 150-1 is not particularly limited. For example, an insulating material may be used. In this case, as the insulating material, a thermosetting resin such as an epoxy resin, a thermoplastic resin such as polyimide, or a mixture of these resins with an inorganic filler, or a resin impregnated with a core material such as a glass fiber, a glass cloth, or a glass fabric, such as a prepreg, an Ajinomoto Build-up Film (ABF), FR-4, a bismaleimide triazine (BT), or the like, may be used. Alternatively, a solder resist may be used.

A second passivation layer 150-2 may protect the frame 110, in particular, the wiring layer 112 from external physical or chemical damage or the like. The second passivation layer 150-2 may have an opening 151 that exposes at least a portion of the wiring layer 112 of the frame 110. The opening 151 may be formed in the second passivation layer 150-2 in the range of tens to millions. The material of the second passivation layer 150-2 is not particularly limited. For example, an insulating material may be used. In this case, as the insulating material, a thermosetting resin such as an epoxy resin, a thermoplastic resin such as polyimide, or a mixture of these resins with an inorganic filler, or a resin impregnated with a core material such as a glass fiber, a glass cloth, or a glass fabric, such as a prepreg, an Ajinomoto Build-up Film (ABF), FR-4, a bismaleimide triazine (BT), or the like, may be used. Alternatively, a solder resist may be used.

An under-bump metal 160 may improve connection reliability of the electrical connection metal 170, thereby improving board level reliability of the package. The under-bump metal 160 may be connected to the redistribution layer 142 of the connection member 140 exposed through the opening of the first passivation layer 150-1. The under-bump metal layer 160 may be formed in the opening of the first passivation layer 150-1 by a known metallization method using a known conductive material, for example, metal, but is not limited thereto.

The electrical connection metal 170 may physically and/or electrically connect the semiconductor package 100A to the outside. For example, the semiconductor package 100A may be mounted on the main board of the electronic device through the electrical connection metal 170. The electrical connection metal 170 may be formed with a solder such as a low melting point metal, for example an alloy containing tin (Sn), more specifically a tin (Sn)-aluminum (Al)-copper (Cu) alloy, or the like, but this may be merely an example and is not particularly limited thereto. The electrical connection metal 170 may be a land, a ball, a pin, or the like. The electrical connection metal 170 may be formed of multiple layers or a single layer. In the case of multiple layers, a copper pillar and a solder may be included. In the case of a single layer, a tin-silver solder or copper may be included, but this may be merely an example and is not limited thereto.

The number, spacing, arrangement type, etc. of the electrical connection metal 170 is not particularly limited, and may be sufficiently modified according to design specifications for a person skilled in the art. For example, the number of electrical connection metals 170 may be from several tens to several thousand, and may have more or less numbers. When the electrical connection metal 170 is a solder ball, the electrical connection metal 170 may cover the sides of the under-bump metal 160 formed extending along one side of the first passivation layer 150-1. In this case, the reliability may be further improved.

At least one of the electrical connection metal 170 may be disposed in a fan-out area of the semiconductor chip 120. The fan-out area refers to an area, except for those in which the semiconductor chip 120 is disposed. The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness.

Figure 11:
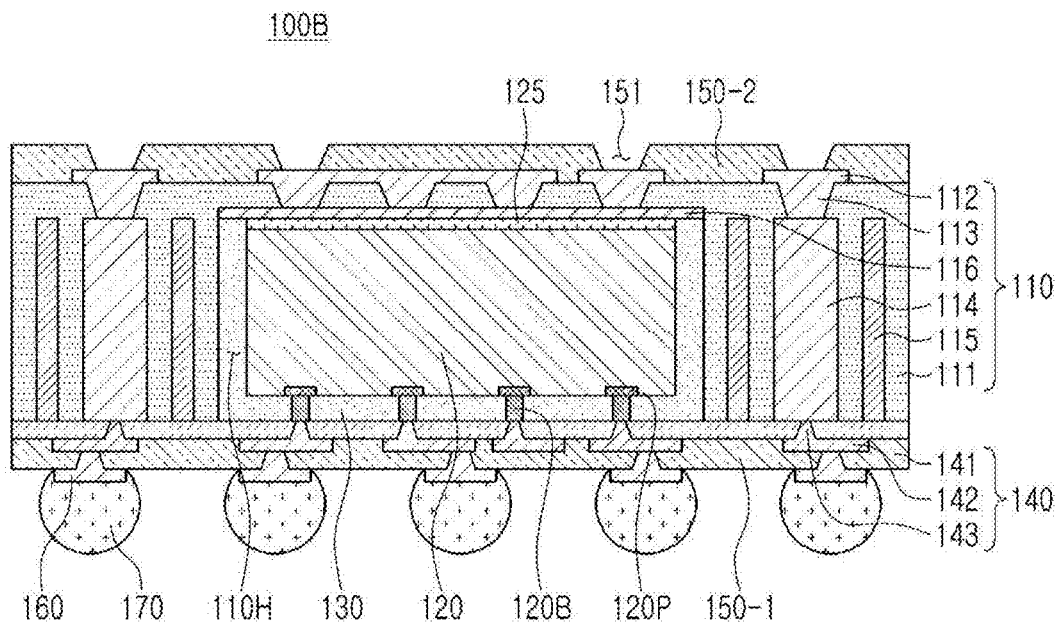
FIGS. 11 and 12 are schematic cross-sectional views illustrating a semiconductor package according to another example.
Figure 12:
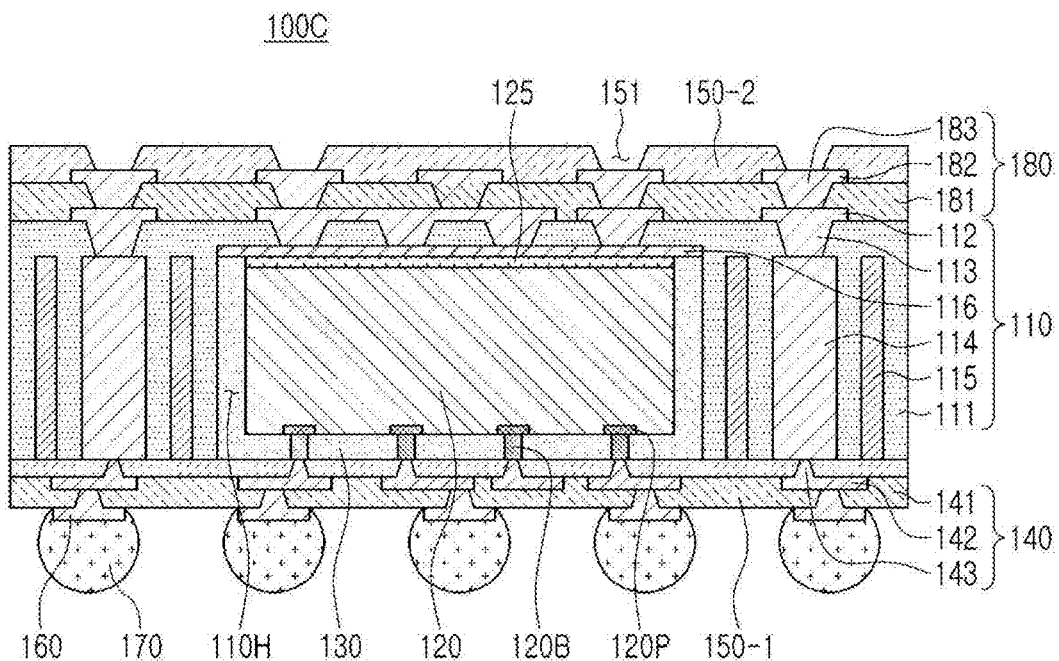

FIGS. 11 and 12 are schematic cross-sectional views illustrating a semiconductor package according to another example.

Referring to FIG. 11, a semiconductor package 100B according to another example may further include an attachment member 125 disposed between a second surface of a semiconductor chip 120 and a metal plate 116. The attachment member 125 may be an attachment member known in the related art, such as a die attach film (DAF).

Referring to FIG. 12, a semiconductor package 100C according to another example may further include a build-up structure 180 including a build-up wiring layer 182 formed on a wiring layer 112 of a frame 110, and a build-up connection via 183 electrically connecting the build-up wiring layer 182 to the wiring layer 112 of the frame 110. A second passivation layer 150-2 disposed on the build-up structure 180 and having a plurality of openings 151 exposing at least a portion of the build-up wiring layer 182 may be also included. The degree of design freedom of the wiring layer 112 of the frame 110 may be improved by further forming the build-up wiring layer 182 on an inactive surface of the semiconductor chip 120. An electrical path of external device through a backside of the semiconductor chip 120 may be variously designed.

Other configurations may be substantially the same as those described in the above-described semiconductor package 100A and the like, and a detailed description thereof will be omitted.

FIGS. 13 to 18 are schematic views illustrating a manufacturing process of a semiconductor package according to another example. The structural features of the semiconductor package having the above-described structure will be more clearly understood from the description of the manufacturing process.

Figure 13:
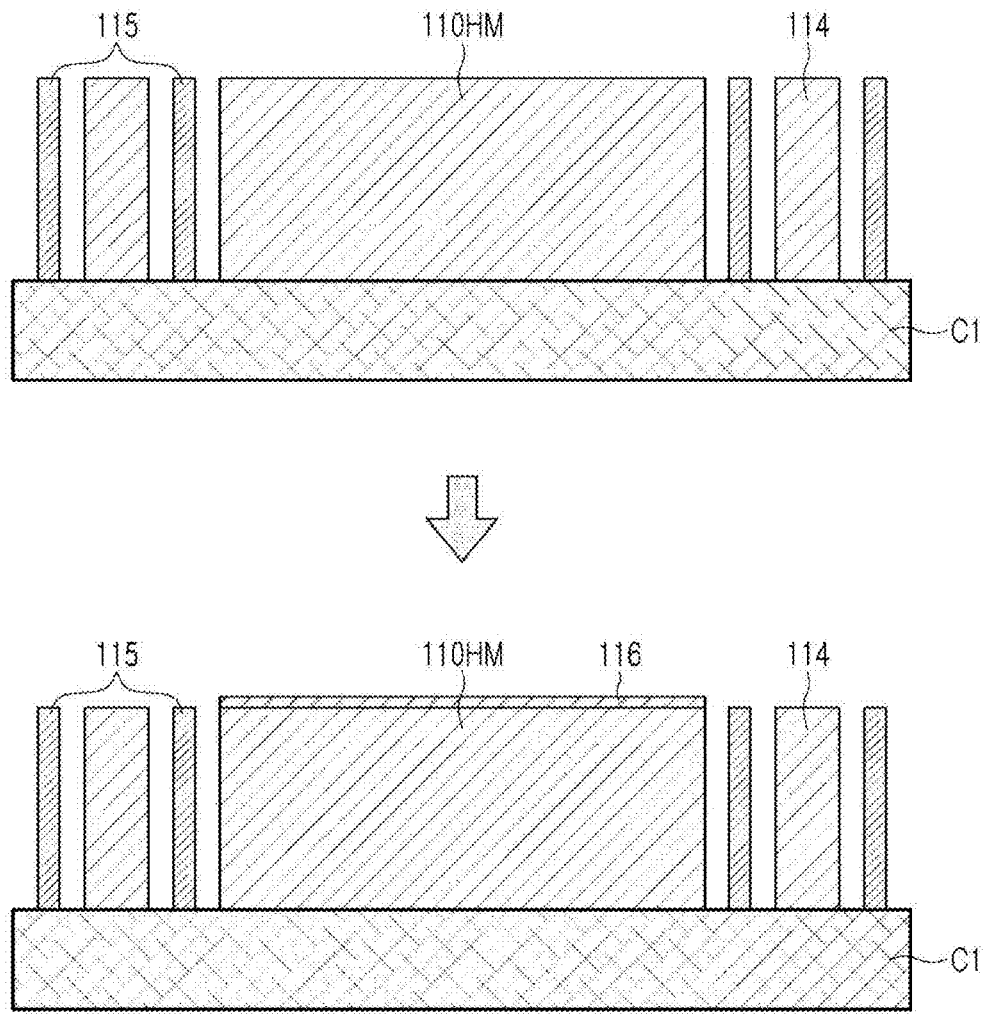
FIGS. 13 to 18 are schematic views illustrating a manufacturing process of a semiconductor package according to another example.

Referring to FIG. 13, a cavity metal 110HM, a first post 114, and a second post 115 patterned on one surface or both surfaces of a first carrier film C1 such as a copper clad laminate (CCL) using a dry film or the like, may be formed. In this case, the first post 114 and the second post 115 may be formed together in a height direction of the cavity metal 110HM, such that the cavity metal 110HM, the first post 114, and the second post 115 may be formed at the same height. In addition, the cavity metal 110HM may be in the form of a semiconductor chip, and the first post 114 may be cylindrical. The second post 115 may be separated from the cavity metal 110HM and the first posts 114, and may be distributed mainly in regions in which the first posts 114 are not formed, but is not limited thereto, such as a predetermined shape. A lower surface of the first post 114 and a lower surface of the second post 115 may be located on the same level as a lower surface of the frame to be formed later. In this case, the same level may be a concept including minute differences due to process errors.

Next, a metal plate 116 may be formed on an upper surface of the cavity metal 110HM. The metal plate 116 may be formed to have the same width as the cavity metal 110HM, and a lower surface of the metal plate 116 may be positioned on the same level as upper surfaces of the first post 114 and the second post 115. Since an insulation layer 111 forming a frame 110 is formed to cover the cavity metal 110HM, the first post 114, and the second post 115, an upper surface of the metal plate 116 may be spaced apart from the second surface of the frame 110 by a predetermined distance. In this case, the same level may be a concept including minute differences due to process errors.

A metal film (not illustrated) may be formed on one surface or both surfaces of the first carrier film C1. The bonding surfaces between the metal films may be surface-treated to facilitate separation in a subsequent separation operation(s). Alternatively, a release layer may be provided between the metal films to facilitate separation in a subsequent operation(s). The first carrier film C1 may be a known insulating substrate, and any material may be used. The metal film may be a copper foil, but is not limited thereto, and may be a thin film made of another conductive material.

Figure 14:
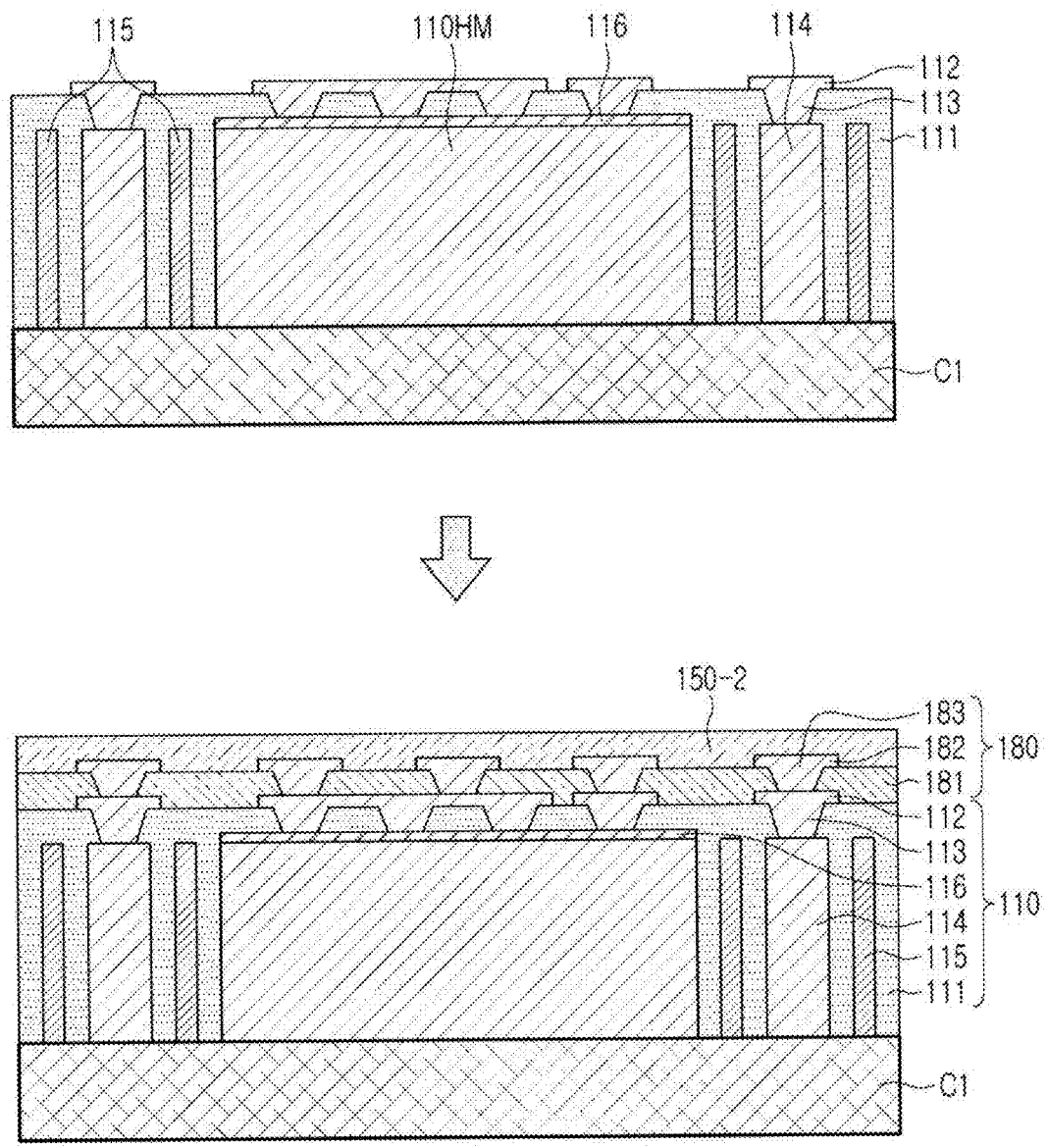

Referring to FIG. 14, an insulation layer 111 filling a space between the cavity metal 110HM, the first post 114, and the second post 115 and covering upper surfaces of the cavity metal 110HM, the first post 114, and the second post 115, a wiring layer 112 formed on the insulation layer 111, and a connection via 113 passing through the insulation layer 111 to electrically connect the wiring layer 112 to any one of the metal plate 116 and the first post 114. The insulation layer 111 may be formed by a method of laminating and curing a precursor by a known lamination method, or a method of applying and curing a precursor material by a known coating method. The wiring layer 112 may be formed using a known plating process, and the connection via 113 may be formed using a mechanical drill and/or a laser drill. Therefore, the connection via 113 may have a shape in which the inner wall is tapered such that a diameter of a surface contacting the first post 114 or the metal plate 116 is narrowed. A boundary surface between the first post 114 and the connection via 113 may be located at a lower level than a boundary surface between the metal plate 116 and the connection via 113.

Next, a build-up insulation layer 181, a build-up wiring layer 182, and a build-up connection via 183 may be formed on the frame 110. The build-up insulation layer 181 may be formed by a method of laminating and curing ABF or the like. Next, a second passivation layer 150-2 covering a build-up structure 180 may be formed.

Figure 15:
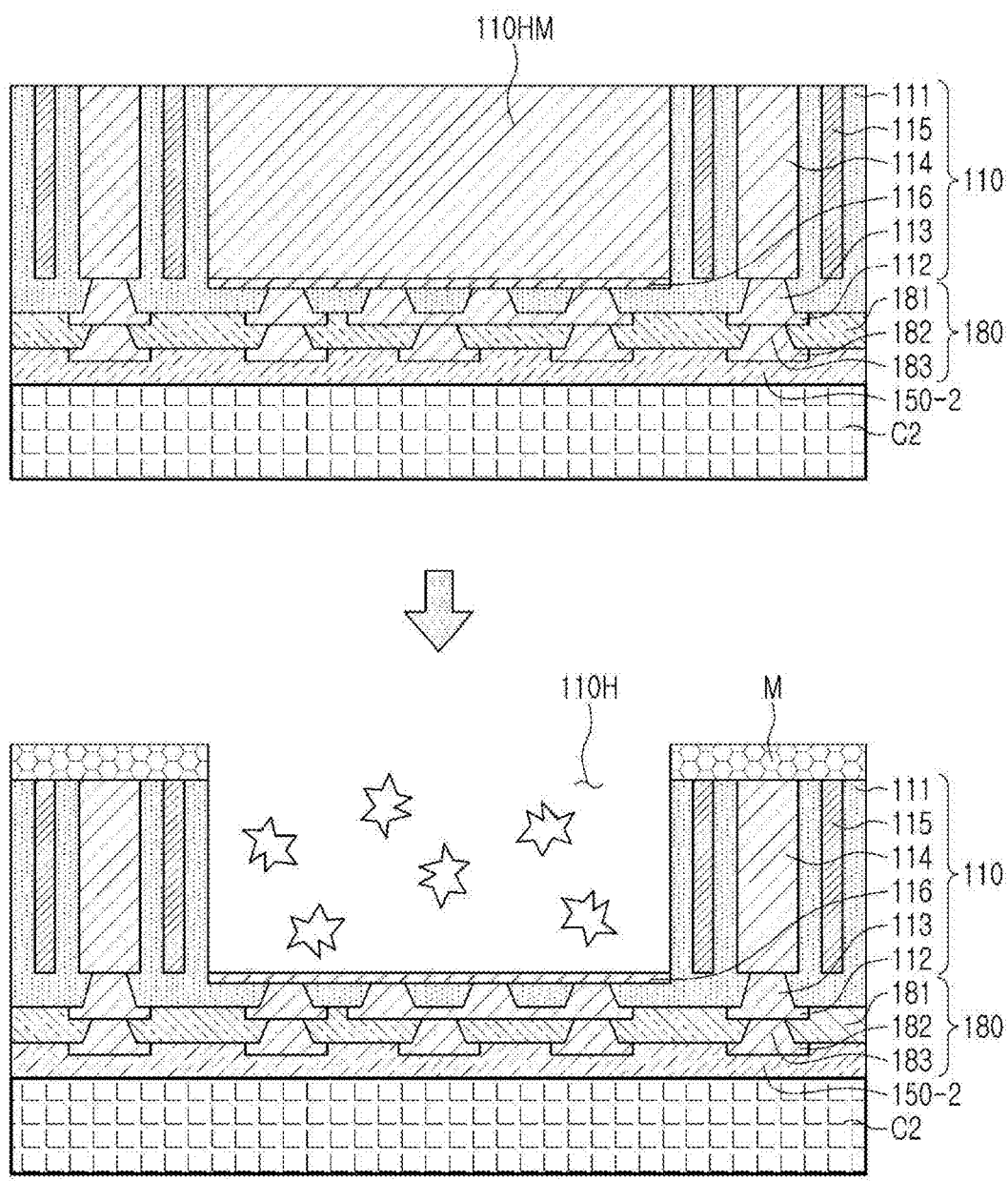

Referring to FIG. 15, the first carrier film C1 may be removed, and a surface on which the second passivation layer 150-2 is disposed may be attached to a second carrier film C2. Next, a dry film M may be masked on the surface of the cavity metal 110HM, the first post 114 and the second post 115 to expose only the cavity metal 110HM by an etching operation. An inner wall of a cavity 110H formed by removing the cavity metal 110HM may be formed to be parallel to side surfaces of the first post 114 and the second post 115. This means that side surfaces of each of the first post 114, the second post 115, and the cavity metal 110HM, formed in the same direction, are parallel to each other. In this case, the expression of "parallel to" refers to a concept including a fine process error.

Figure 16:
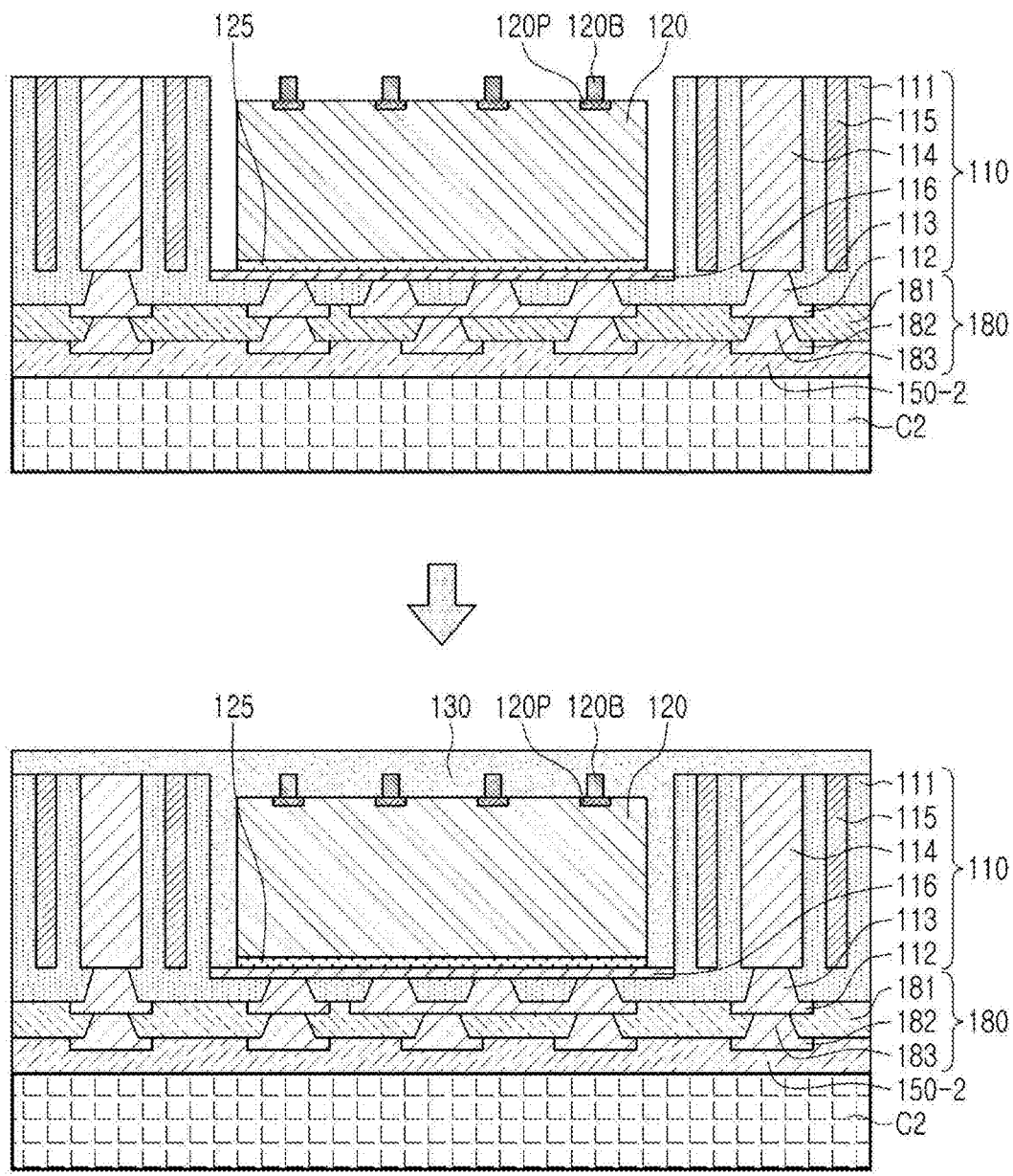

Referring to FIG. 16, after removing the dry film M, a semiconductor chip 120 may be placed in the cavity 110H such that an inactive surface thereof may be attached to the metal layer 116. In this attachment operation, an attachment member 125 known in the related art such as a die attach film (DAF) may be used. The semiconductor chip 120 may be attached to a connection pad 120P with a bump 120B such as a copper pillar formed thereon. Then, at least a portion of the semiconductor chip 120 and the frame 110 may be encapsulated using an encapsulant 130. The encapsulant 130 may be formed by laminating and curing ABF or the like.

Figure 17:
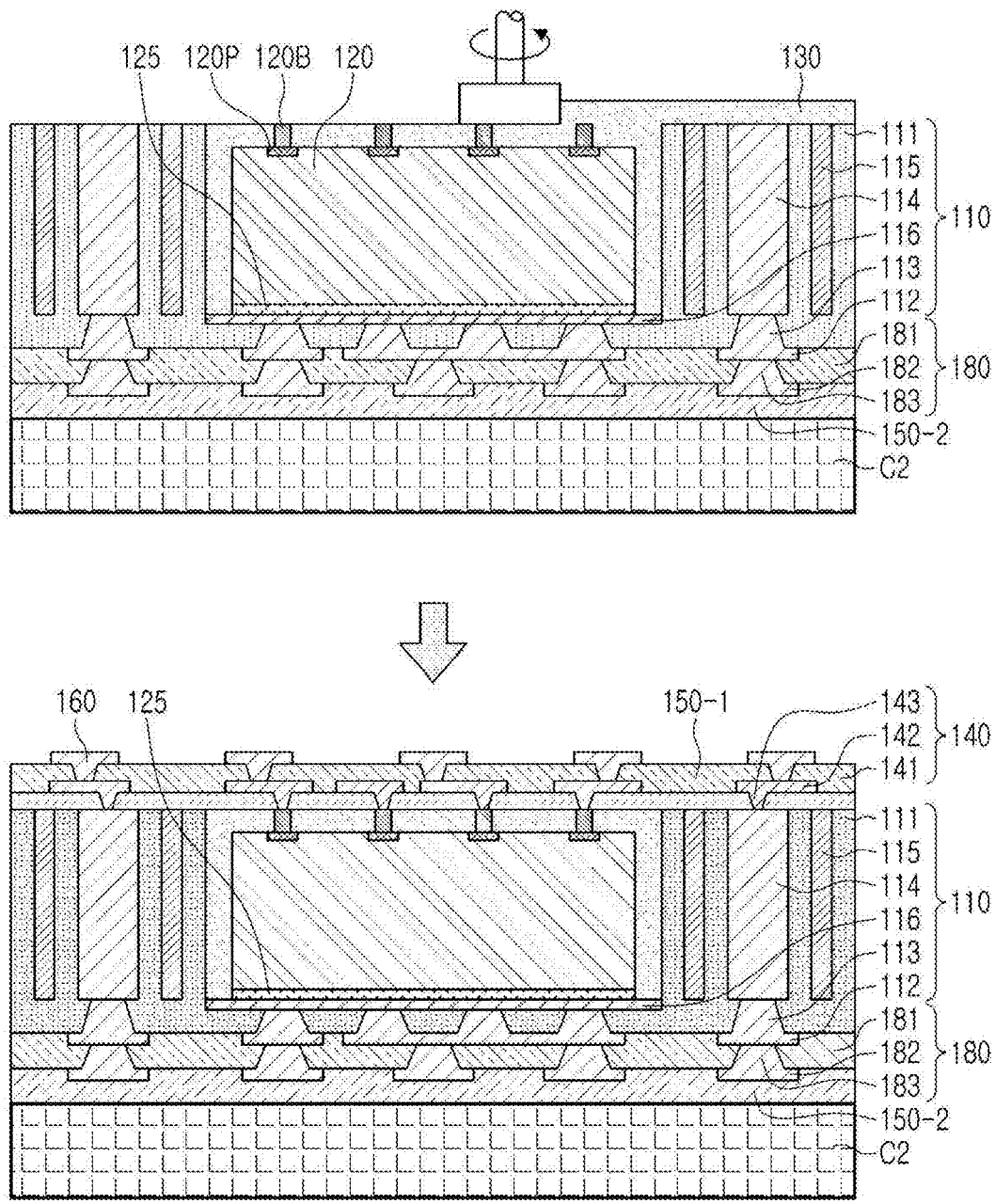

Referring to FIG. 17, the encapsulant 130 may be then grinded such that a surface of the bump 120B may be exposed. A surface of the encapsulant 130 may be flattened by the grinding operation, such that a surface of the bump 120B and surfaces of the first post 114 and the second post 115 may be exposed. The encapsulant 130 covering the upper surface of the frame 110 may be formed such that the grinded surface of the frame 110, the grinded surface of the encapsulant 130 covering the semiconductor chip 120, and the grinded surface of the bump 120B of the semiconductor chip may be coplanar to one another. Therefore, a thickness of the package may be reduced, while warpage may be minimized. Likewise, the expression of "same" refers to a concept involving fine differences due to process errors.

Next, a connection structure 140 may be formed on a first surface of the frame 110 flattened by the grinding operation. The connection structure 140 may form an insulation layer 141, and may form a redistribution layer 142 and a redistribution via 143 on the insulation layer 141 using a plating operation and a photolithography operation. As necessary, a first passivation layer 150-1 may be formed on the connection structure 140. The first passivation layer 150-1 may be formed by a method of laminating and curing a precursor of the first passivation layer 150-1, by a method of applying and curing a forming material of the first passivation layer 150-1, or the like. An opening (numeral thereof not illustrated) may be formed in the first passivation layer 150-1 to expose at least a portion of the redistribution layer 142 of the connection structure 140, and an under-bump metal 160 may be formed thereon using a known metallization method.

Figure 18:
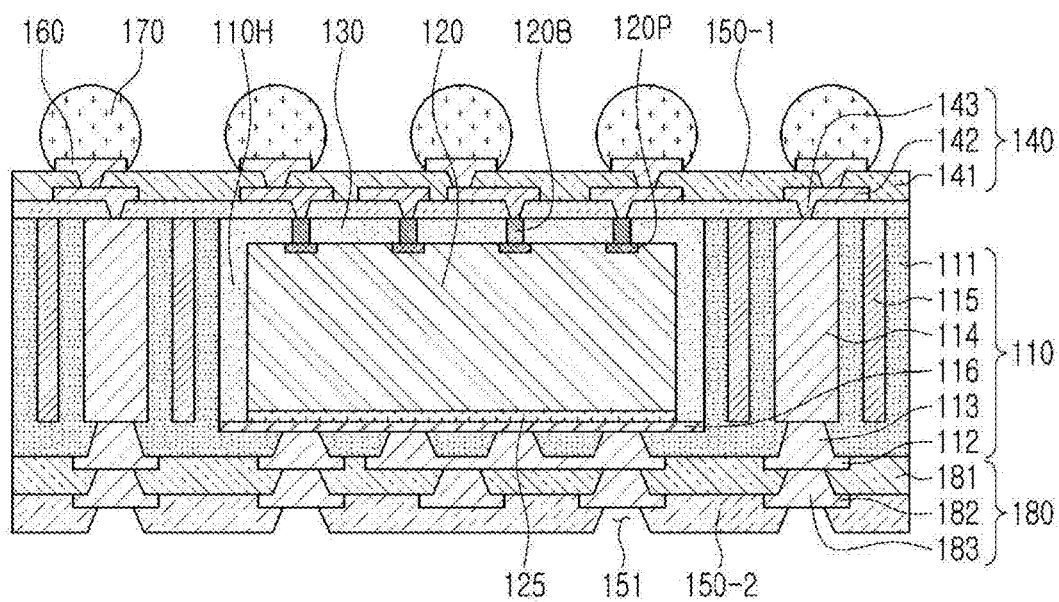

Referring to FIG. 18, an electrical connection metal 170 may be then formed on the under-bump metal 160. The method of forming the electrical connection metal 170 is not particularly limited, and may be formed by a method well known in the art, depending on its structure and form. The electrical connection metal 170 may be fixed by a reflow operation, and a portion of the electrical connection metal 170 may have a configuration of covering a side surface of the bump metal 160, protruded toward an upper portion of the first passivation layer 150-1, to facilitate a fixation force. As necessary, the opening 151 may be formed through the second passivation layer 150-2 from which the second carrier film C2 is removed to expose a portion of the build-up wiring layer 182.

In the present disclosure, the words lower, lower portion, lower surface, and the like are used to refer to a direction toward the mounting surface of the fan-out semiconductor package with respect to the cross section of the drawing for convenience, while the words upper, upper portion, upper surface, and the like are used to refer to a direction opposite thereto. It should be understood that, the definitions refer to directions for convenience of explanation, the scope of the claims is not particularly limited by the description of such directions.

The term of "connect" or "connection" in the present disclosure may be not only a direct connection, but also a concept including an indirect connection through an adhesive layer or the like. In addition, the term "electrically connected" or "electrical connection" means a concept including both a physical connection and a physical non-connection. Also, the expressions of "first," second," etc. are used to distinguish one component from another, and do not limit the order and/or importance of the components. In some cases, without departing from the spirit of the invention, the first component may be referred to as a second component, and similarly, the second component may be referred to as a first component.

The uses of the expression "an example embodiment" used in the present disclosure do not all refer to the same embodiment, but may be provided for emphasizing and explaining different unique features. However, the above-mentioned example embodiments do not exclude that they are implemented in combination with the features of other example embodiments. For example, although the description in the specific example embodiment may be not described in another example embodiment, it may be understood as an explanation related to another example embodiment, unless otherwise described or contradicted by the other example embodiment.

The terms used in the present disclosure are used only to illustrate an example embodiment, and are not intended to limit the present disclosure. At this time, the singular expressions include plural expressions unless the context clearly dictates otherwise.

As one of various effects of the present disclosure, a semiconductor package having improved heat dissipation performance and relatively high degree of design freedom may be provided.

While example embodiments have been shown and described above, it will be apparent to those skilled in the art that modifications and variations could be made without departing from the scope of the present disclosure as defined by the appended claims.

What is claimed is:

1. A semiconductor package comprising:
a frame including an insulation layer having a cavity in a lower surface of the insulation layer, a first post and a second post embedded in the insulation layer and spaced apart from the cavity, a wiring layer disposed on an upper surface of the insulation layer, and a metal plate disposed on an upper side of the cavity;
a semiconductor chip having a first surface on which a connection pad is disposed and a second surface opposing the first surface, and including a bump disposed on the connection pad, the semiconductor chip being disposed in the cavity and the second surface facing the metal plate;
an encapsulant covering at least a portion of the semiconductor chip; and
a connection structure disposed on the frame and the first surface of the semiconductor chip, and including one or more redistribution layers electrically connected to the bump of the semiconductor chip,
wherein the first post is electrically connected to the wiring layer of the frame and the redistribution layer of the connection structure, and
the second post is spaced apart from the first post.

2. The semiconductor package according to claim 1, wherein the first post and the second post extend in a height direction of the cavity.

3. The semiconductor package according to claim 1, wherein an upper surface of the metal plate is spaced apart from an upper surface of the insulation layer.

4. The semiconductor package according to claim 1, wherein an upper surface of the first post and an upper surface of the second post are located on the same level as a lower surface of the metal plate of the frame.

5. The semiconductor package according to claim 1, wherein a lower surface of the first post and a lower surface of the second post are located on the same level as a lower surface of the insulation layer of the frame.

6. The semiconductor package according to claim 1, wherein an inner wall of the cavity is parallel to side surfaces of the first post and the second post.

7. The semiconductor package according to claim 1, wherein the frame further comprises a connection via passing through at least a portion of the insulation layer to connect the wiring layer to the first post and the metal plate.

8. The semiconductor package according to claim 7, wherein the connection via has a tapered inner wall.

9. The semiconductor package according to claim 7, wherein a boundary surface between the first post and the connection via is located on a level lower than a boundary surface between the metal plate and the connection via.

10. The semiconductor package according to claim 1, wherein a boundary surface between the connection structure and the bump of the semiconductor chip is located on the same level as a boundary surface between the connection structure and the encapsulant.

11. The semiconductor package according to claim 1, wherein a boundary surface between the connection structure and the first post is located on the same level as a boundary surface between the connection structure and the bump of the semiconductor chip.

12. The semiconductor package according to claim 1, further comprising:
a first passivation layer disposed on the connection structure and having a plurality of openings exposing at least a portion of the redistribution layer; and
a second passivation layer disposed on an upper surface of the frame and having a plurality of openings exposing at least a portion of the wiring layer.

13. The semiconductor package according to claim 12, further comprising:
a plurality of under-bump metals respectively disposed on the openings of the first passivation layer and electrically connected to the exposed redistribution layer; and
a plurality of electrical connection metals disposed on the first passivation layer and electrically connected to the exposed redistribution layer through the under-bump metal.

14. The semiconductor package according to claim 1, further comprising an attachment member disposed between the second surface of the semiconductor chip and the metal plate.

15. The semiconductor package according to claim 1, further comprising a build-up structure including a build-up wiring layer formed on the wiring layer of the frame, and a build-up connection via electrically connecting the build-up wiring layer and the wiring layer of the frame.

16. The semiconductor package according to claim 15, further comprising a second passivation layer disposed on the build-up structure and having a plurality of openings exposing at least a portion of the build-up wiring layer.

17. A semiconductor package comprising:
a connection structure including a redistribution layer;
an insulation layer disposed on the connection structure and having a cavity;
a first post and a second post embedded in the insulation layer and extending from the connection structure;
a semiconductor chip having a first surface on which a connection pad is disposed and a second surface opposing the first surface, and including a bump connecting the connection pad and the connection structure to each other;
an encapsulant filling the cavity and separating side surfaces of the semiconductor chip and the insulating layer from each other;
a metal plate disposed between the insulating layer and the second surface of the semiconductor chip; and
a wiring layer disposed on the insulating layer,
wherein the first post is electrically connected to the wiring layer, the redistribution layer, and the connecting pad.

18. The semiconductor package according to claim 17, wherein the second post is electrically insulated from the first post, the wiring layer, the redistribution layer, and the connection pad.

19. The semiconductor package according to claim 17, wherein the second post surrounds in the first post and is spaced apart from the first post by the insulating layer.

20. The semiconductor package according to claim 17, wherein the connection structure includes a layer of vias which connect the redistribution layer to the first post and the bump, respectively.

* * * * *